(12) United States Patent
Lee

(10) Patent No.: US 12,080,828 B2
(45) Date of Patent: Sep. 3, 2024

(54) VERTICAL LIGHT-EMITTING DIODE

(71) Applicant: SEOUL VIOSYS CO., LTD., Gyeonggi-do (KR)

(72) Inventor: Joon Hee Lee, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 408 days.

(21) Appl. No.: 17/538,021

(22) Filed: Nov. 30, 2021

(65) Prior Publication Data

US 2022/0149241 A1 May 12, 2022

Related U.S. Application Data

(63) Continuation of application No. PCT/KR2019/017222, filed on Dec. 6, 2019.

(30) Foreign Application Priority Data

May 30, 2019 (KR) .................... 10-2019-0064076

(51) Int. Cl.
*H01L 33/38* (2010.01)
*H01L 27/15* (2006.01)
(Continued)

(52) U.S. Cl.
CPC .......... *H01L 33/382* (2013.01); *H01L 27/156* (2013.01); *H01L 33/10* (2013.01);
(Continued)

(58) Field of Classification Search
CPC ..... H01L 33/382; H01L 27/156; H01L 33/10; H01L 33/22; H01L 33/32; H01L 33/405;
(Continued)

(56) References Cited

U.S. PATENT DOCUMENTS 10,290,769 B2 5/2019 Lee et al.
2013/0228744 A1* 9/2013 Kazama ................ H01L 33/382
257/13

(Continued)

FOREIGN PATENT DOCUMENTS

DE 102017117414 A1 2/2019
KR 20120031340 A * 4/2012 ........... H01L 33/382
(Continued)

OTHER PUBLICATIONS

International Search Report for International Application No. PCT/KR2019/017222, mailed Apr. 29, 2020, 2 pages.
(Continued)

*Primary Examiner* — S M Sohel Imtiaz
(74) *Attorney, Agent, or Firm* — LaBatt, LLC

(57) ABSTRACT

A light-emitting diode includes a first conductive semiconductor layer, an upper insulating layer positioned on the first conductive semiconductor layer, a mesa including an active layer and a second conductive semiconductor layer and positioned under a certain region of the first conductive semiconductor layer, and first and second through-holes through which the first conductive semiconductor layer is exposed. The first through-holes are arranged in a region encompassed by the edge of the mesa. The second through-holes are arranged along the edge of the mesa so that some of the second through-holes are encompassed by the active layer and the second conductive semiconductor layer, respectively.

20 Claims, 14 Drawing Sheets

(51) Int. Cl.
- *H01L 33/10* (2010.01)
- *H01L 33/22* (2010.01)
- *H01L 33/32* (2010.01)
- *H01L 33/40* (2010.01)
- *H01L 33/62* (2010.01)

(52) U.S. Cl.
CPC .............. *H01L 33/22* (2013.01); *H01L 33/32* (2013.01); *H01L 33/405* (2013.01); *H01L 33/62* (2013.01)

(58) Field of Classification Search
CPC ....... H01L 33/62; H01L 33/08; H01L 33/385; H01L 33/44; H01L 33/20; H01L 33/38
See application file for complete search history.

(56) References Cited

U.S. PATENT DOCUMENTS

| | | | | |
|---|---|---|---|---|
| 2014/0110729 | A1* | 4/2014 | Seo | H01L 33/007 257/88 |
| 2014/0209952 | A1* | 7/2014 | Ye | H01L 33/46 257/98 |
| 2014/0339566 | A1* | 11/2014 | Seo | H01L 33/42 438/46 |
| 2014/0367722 | A1* | 12/2014 | Im | H01L 33/20 257/98 |
| 2017/0148946 | A1* | 5/2017 | Lee | H01L 33/04 |
| 2019/0027649 | A1* | 1/2019 | Yoon | H01L 33/007 |
| 2019/0044027 | A1 | 2/2019 | Lee et al. | |
| 2021/0091269 | A1* | 3/2021 | Oszinda | H01L 33/0093 |

FOREIGN PATENT DOCUMENTS

| | | |
|---|---|---|
| KR | 1020130054041 A | 5/2013 |
| KR | 1020160037060 A | 4/2016 |
| KR | 1020170142054 A | 12/2017 |
| KR | 20180084652 A | 7/2018 |
| KR | 1020180084652 A | 7/2018 |

OTHER PUBLICATIONS

Office Action for KR Application No. 10-2019-0064076 with English translation, Feb. 18, 2024, 10 pages.

Extended European Search Report for European Application No. 19930229.0, mailed Jun. 6, 2023, 9 pages.

* cited by examiner

VERTICAL LIGHT-EMITTING DIODE

CROSS-REFERENCE OF RELATED APPLICATIONS AND PRIORITY

The Present Application is a bypass continuation of International Application No. PCT/KR2019/017222 filed Dec. 6, 2019, which claims priority to Korean Patent Application No. 10-2019-0064076 filed May 30, 2019, the disclosure of which are incorporated by reference as if they are fully set forth herein.

TECHNICAL FIELD

Embodiments of the present disclosure relate to a light emitting diode and, more particularly, to a vertical light emitting diode having improved current spreading performance. Embodiments of the present disclosure further relates to a light emitting diode for use in a lighting apparatus.

BACKGROUND

In general, group III-based nitride semiconductors, such as gallium nitride (GaN) and aluminum nitride (AlN), have good thermal stability and a direct transition energy-band structure, and thus have been spotlighted as materials for light emitting devices emitting light in the visible range and in the UV range.

Such group III-based nitride semiconductor layers are grown on a heterogeneous substrate having a similar crystal structure by Metal Organic Chemical Vapor Deposition (MOCVD) or Molecular Beam Epitaxy (MBE) due to difficulty in fabrication of a homogeneous substrate capable of growing the group III-based nitride semiconductor layers. As the heterogeneous substrate, a sapphire substrate having a hexagonal crystal structure is generally used. However, since sapphire is an electrically non-conductive material, sapphire can restrict the structure of a light emitting diode. Accordingly, there have been developed a technique for manufacturing a high efficiency vertical light emitting diode, in which epitaxial layers such as nitride semiconductor layers are grown on a heterogeneous substrate, such as a sapphire substrate, and a support substrate is bonded to the epitaxial layers, followed by separating the heterogeneous substrate through laser lift-off or the like.

Generally, a vertical light emitting diode has better current spreading performance than a typical lateral type light emitting diode and exhibits good heat dissipation performance through adoption of a support substrate having higher thermal conductivity than sapphire. In addition, a reflective metal layer may be formed between the support substrate and the semiconductor layers to reflect light traveling towards the support substrate, thereby improving light extraction efficiency.

Further, the vertical light emitting diode can improve light extraction efficiency through a roughened surface of an epitaxial layer (n-type semiconductor layer) through which light is emitted. To this end, the epitaxial layers are subjected to wet etching such as photo-enhanced chemical (PEC) etching. The roughened surface of the epitaxial layer need protection from an external environment. In particular, as a light emitting diode, emitting short wavelength UV light including a nitride epitaxial layer containing Al, such as AlGaN, is vulnerable to moisture, there is a need for protection of the light emitting diode.

The vertical light emitting diode generally employs a conductive support substrate and includes an anode pad on the support substrate and a cathode pad on the epitaxial layers. In addition, an electrode extension extending from the cathode pad and electrically contacting the epitaxial layers is used to assist in current spreading within the epitaxial layers. The electrode extension may be formed not only in a central region of the light emitting diode, but also near edges of the epitaxial layers to evenly distribute the current over a large area of the epitaxial layers. However, since the cathode pad and the electrode extension are disposed on an epitaxial layer through which light is emitted, light emission is blocked by the cathode pad and the electrode extension, thereby deteriorating luminous efficacy of the light emitting diode.

SUMMARY

Embodiments of the present disclosure provide a vertical light emitting diode having a new structure capable of achieving more uniform current spreading over a large area.

Embodiments of the present disclosure provide a light emitting diode having a vertical structure capable of preventing moisture intrusion from an external environment.

In accordance with one embodiment of the present disclosure, a light emitting diode includes a support substrate, a first conductivity type semiconductor layer disposed on the support substrate, an upper insulation layer disposed on the first conductivity type semiconductor layer, and a mesa including an active layer and a second conductivity type semiconductor layer and disposed under a partial region of the first conductivity type semiconductor layer to expose an edge of the first conductivity type semiconductor layer. The mesa has first through-holes and second through-holes exposing the first conductivity type semiconductor layer through the second conductivity type semiconductor layer and the active layer. The light emitting diode further includes a first electrode disposed between the second conductivity type semiconductor layer and the support substrate and a second electrode disposed between the first electrode and the second conductivity type semiconductor layer. The first electrode includes first contact portions electrically connected to the first conductivity type semiconductor layer through the first through-holes and second contact portions electrically connected to the first conductivity type semiconductor layer through the second through-holes. The second electrode is electrically connected to the second conductivity type semiconductor layer. The light emitting diode also includes at least one upper electrode pad disposed adjacent to the first conductivity type semiconductor layer and connected to the second electrode. Each of the first through-holes is surrounded by the active layer and the second conductivity type semiconductor layer and is disposed within a region surrounded by edges of the mesa. Each of the second through-holes is partially surrounded by the active layer and the second conductivity type semiconductor layer and is disposed along the edge of the mesa. The upper insulation layer includes a plurality of material layers.

Embodiments of the present disclosure provide a vertical light emitting diode that can achieve even spreading of electric current over the entire region of a mesa through first contact portions formed in first through-holes arranged along an edge of a mesa. Further, the vertical light emitting diode includes an upper insulation layer composed of a plurality of material layers to prevent nitride semiconductor layers from being damaged due to an external environment, such as moisture and the like, thereby improving reliability of the light emitting diode.

The above and other features and advantages of the present disclosure will become apparent from the following detailed description.

DESCRIPTION OF DRAWINGS

FIG. 3A illustrates forming a semiconductor stack on a growth substrate;

FIG. 3B illustrates a sectional view of FIG. 3A;

FIG. 4A illustrates forming a first insulation layer to cover a mesa;

FIG. 4B illustrates a sectional view of FIG. 4A;

FIG. 5A illustrates forming openings to expose a first conductivity type semiconductor layer;

FIG. 5B illustrates a sectional view of FIG. 5A;

FIG. 6A illustrates attaching a support substrate to the semiconductor stack structure;

FIG. 6B illustrates a sectional view of FIG. 6A;

FIG. 7A illustrates forming an upper insulation layer on the first conductivity type semiconductor layer; and FIG. 7B illustrates a sectional view of FIG. 7A.

FIG. 9A illustrates a luminous pattern of the light emitting diode having a vertical structure;

FIG. 9B illustrates a luminous pattern of a light emitting diode having no second through-holes; and FIG. 9C illustrates a luminous pattern of the light emitting diode having contact portions in first and second through-holes.

DETAILED DESCRIPTION OF EMBODIMENTS

Figure 1:
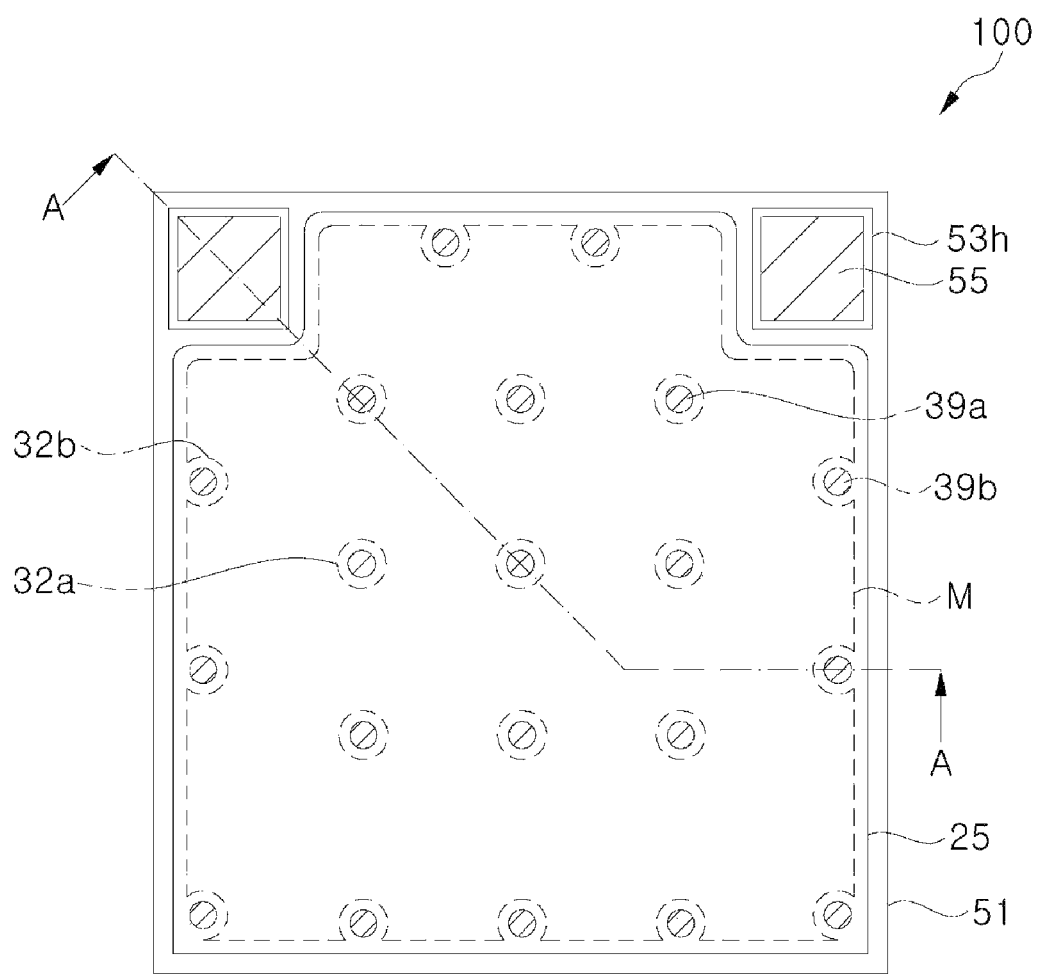
FIG. 1 is a schematic plan view of a light emitting diode according to one embodiment of the present disclosure.

Hereinafter, embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes.

In accordance with one embodiment of the present disclosure, a light emitting diode includes a support substrate, a first conductivity type semiconductor layer disposed on the support substrate, an upper insulation layer disposed on the first conductivity type semiconductor layer, a mesa including an active layer and a second conductivity type semiconductor layer disposed under a partial region of the first conductivity type semiconductor layer to expose an edge of the first conductivity type semiconductor layer, a first electrode disposed between the second conductivity type semiconductor layer and the support substrate, a second electrode disposed between the first electrode and the second conductivity type semiconductor layer, and at least one upper electrode pad disposed adjacent to the first conductivity type semiconductor layer and connected to the second electrode. The mesa has first through-holes and second through-holes exposing the first conductivity type semiconductor layer through the second conductivity type semiconductor layer and the active layer. The first electrode includes first contact portions electrically connected to the first conductivity type semiconductor layer through the first through-holes and second contact portions electrically connected to the first conductivity type semiconductor layer through the second through-holes. The second electrode is electrically connected to the second conductivity type semiconductor layer. Each of the first through-holes is surrounded by the active layer and the second conductivity type semiconductor layer and is disposed within a region surrounded by an edge of the mesa. Each of the second through-holes is partially surrounded by the active layer and the second conductivity type semiconductor layer and is disposed along the edge of the mesa, and the upper insulation layer includes a plurality of material layers.

The first conductivity type semiconductor layer may have a roughened surface. In one embodiment, the upper insulation layer may include a first layer covering the roughened surface of the first conductivity type semiconductor layer, a second layer covering the first layer and having a higher refractive index than the first layer, and a third layer covering the second layer and having a lower refractive index than the second layer. For example, the first layer and the third layer may include $SiO_2$ and the second layer may include $Al_2O_3$. The first layer may have a greater thickness than the second layer and the third layer. The upper insulation layer may include an $Al_2O_3$ layer covering the roughened surface of the first conductivity type semiconductor layer and a $SiO_2$ layer covering the $Al_2O_3$ layer.

The first conductivity type semiconductor layer may include an Al-containing nitride semiconductor layer.

The support substrate may have a rectangular shape. In one embodiment, the upper electrode pad may extend along one edge of the support substrate to be longitudinally disposed between one edge of the mesa and one edge of the support substrate. Furthermore, some of the second through-holes may be disposed between the upper electrode pad and the mesa.

In another embodiment, two upper electrode pads may be disposed near opposite corners of the support substrate along one edge of the support substrate. Further, a partial region of the mesa may be disposed between the two upper electrode pads and some of the second through-holes may be formed in the partial region of the mesa disposed between the two upper electrode pads.

The second through-holes may be arranged to be disposed adjacent four edges of the support substrate.

The light emitting diode may have a mirror symmetry structure. With this structure, the light emitting diode can symmetrically spread electric current.

The light emitting diode may further include: a first insulation layer insulating the first electrode from the first conductivity type semiconductor layer; and a second insulation layer interposed between the first electrode and the second electrode. Further, the light emitting diode may further include a reflection layer disposed between the second insulation layer and the first electrode. The reflection layer may include a distributed Bragg reflector.

The light emitting diode may further include: a bonding metal layer interposed between the first electrode and the support substrate; and a first electrode-protecting metal layer interposed between the bonding metal layer and the first electrode and covering the first electrode.

The second electrode may include an ohmic reflection layer forming ohmic contact with the second conductivity type semiconductor layer and a protective metal layer protecting the ohmic reflection layer. The protective metal layer may extend outside the first conductivity type semiconductor layer and the upper electrode pad may be connected to the protective metal layer. In one embodiment, the upper electrode pad may be connected to the protective metal layer through the upper insulation layer and the first insulation layer.

The light emitting diode may further include a second insulation layer interposed between the first electrode and the second electrode and covering a side surface of the protective metal layer.

According to one or more embodiments of the present disclosure, a light emitting diode includes a support substrate, a first conductivity type semiconductor layer disposed on the support substrate, an upper insulation layer disposed on the first conductivity type semiconductor layer and comprising a plurality of material layers, a mesa, a first electrode, a second electrode, and at least one upper electrode pad. The mesa includes an active layer and a second conductivity type semiconductor layer and disposed under a partial region of the first conductivity type semiconductor layer to expose an edge of the first conductivity type semiconductor layer. The mesa has a plurality of first through-holes and a plurality of second through-holes exposing the first conductivity type semiconductor layer through the second conductivity type semiconductor layer and the active layer. The first electrode is disposed between the second conductivity type semiconductor layer and the support substrate. The first electrode includes first contact portions electrically connected to the first conductivity type semiconductor layer through the plurality of first through-holes and second contact portions electrically connected to the first conductivity type semiconductor layer through the plurality of second through-holes. The second electrode is disposed between the first electrode and the second conductivity type semiconductor layer and electrically connected to the second conductivity type semiconductor layer. The at least one upper electrode pad is disposed adjacent to the first conductivity type semiconductor layer and connected to the second electrode. One or more of the plurality of first through-holes are surrounded by the active layer and the second conductivity type semiconductor layer and are disposed within a region surrounded by edges of the mesa. One or more of the plurality of second through-holes are partially surrounded by the active layer and the second conductivity type semiconductor layer and are disposed along the edges of the mesa.

In at least one variant, the first conductivity type semiconductor layer has a roughened surface. The upper insulation layer comprises a first layer covering the roughened surface of the first conductivity type semiconductor layer, a second layer covering the first layer and having a higher refractive index than the first layer, and a third layer covering the second layer and having a lower refractive index than the second layer.

In another variant, both the first layer and the third layer comprise $SiO_2$ and the second layer comprises $Al_2O_3$.

In another variant, a thickness of the first layer is greater than a thickness of the second layer, and the thickness of the first layer is greater than a thickness of the third layer.

In another variant, the first conductivity type semiconductor layer comprises an Al-containing nitride semiconductor layer.

In another variant, the first conductivity type semiconductor layer has a roughened surface and the upper insulation layer comprises an $Al_2O_3$ layer covering the roughened surface of the first conductivity type semiconductor layer and a $SiO_2$ layer covering the $Al_2O_3$ layer.

In another variant, the support substrate has a rectangular shape, and the at least one upper electrode pad extends along one edge of the support substrate such that the upper electrode pad is longitudinally disposed in a space formed between the one edge of the mesa and one edge of the support substrate.

In another variant, one or more of the second through-holes are disposed between the upper electrode pad and the one edge of the mesa.

In another variant, the support substrate has a rectangular shape, and the at least one upper electrode pad further comprises a first upper electrode pad and a second upper electrode pad disposed near opposite corners of the support substrate along edges of the support substrate corresponding to the opposite corners.

In another variant, a partial region of the mesa is disposed between the first and the second upper electrode pads, and one or more of the plurality of second through-holes are formed in the partial region of the mesa disposed between the first and the second upper electrode pads.

In another variant, the plurality of second through-holes are arranged to be disposed adjacent four edges of the support substrate.

In another variant, the first and the second upper electrode pads, the mesa, the plurality of first through-holes and the plurality of second through-holes form a mirror symmetry structure.

In another variant, the light emitting diode further includes a first insulation layer insulating the first electrode from the first conductivity type semiconductor layer, a second insulation layer interposed between the first electrode and the second electrode, and a reflection layer disposed between the second insulation layer and the first electrode, the reflection layer comprising a distributed Bragg reflector.

In another variant, the light emitting diode further includes a bonding metal layer interposed between the first electrode and the support substrate, and a first electrode-protecting metal layer interposed between the bonding metal layer and the first electrode and covering the first electrode.

In another variant, the second electrode comprises an ohmic reflection layer forming ohmic contact with the second conductivity type semiconductor layer and a protective metal layer protecting the ohmic reflection layer. The protective metal layer extends outside the first conductivity type semiconductor layer and the at least one upper electrode pad is connected to the protective metal layer through the upper insulation layer and the first insulation layer. The second insulation layer covers a side surface of the protective metal layer.

According to one or more embodiments of the present disclosure, a lighting apparatus includes a light emitting device module, a body configured to receive the light emitting device module, a cover structure including a light transmitting material and configured to transmit light from the light emitting device module. The light emitting device module further includes at least one substrate and a plurality of light emitting diodes including the light emitting diode as described in the above embodiments.

In at least one variant, the cover structure is further shaped to adjust orientation of the light from the light emitting device module. The orientation of the light from the light emitting device module is adjusted as optical transmissivity of the light transmitting material varies.

According to one or more embodiments of the present disclosure, a light emitting diode includes a first conductivity type semiconductor layer, an upper insulation layer disposed on the first conductivity type semiconductor layer, a mesa comprising an active layer and a second conductivity type semiconductor layer and disposed under the first conductivity type semiconductor layer to expose an edge of the first conductivity type semiconductor layer, a plurality of first through-holes and a plurality of second through-holes exposing the first conductivity type semiconductor layer through the second conductivity type semiconductor layer and the active layer, a first electrode, and a second electrode. The first electrode includes first contact portions electrically connected to the first conductivity type semiconductor layer through the plurality of first through-holes, and second contact portions electrically connected to the first conductivity type semiconductor layer through the plurality of second through-holes. The second electrode is disposed between the first electrode and the second conductivity type semiconductor layer and electrically connected to the second conductivity type semiconductor layer. One or more of the plurality of first through-holes are disposed within a region surrounded by edges of the mesa. One or more of the plurality of second through-holes are disposed along the edges of the mesa.

In at least one variant, the light emitting diode further includes at least one upper electrode pad disposed adjacent to the first conductivity type semiconductor layer and connected to the second electrode. The plurality of second through-holes are arranged to be disposed adjacent four edges of the mesa.

In another variant, the at least one upper electrode pad, the mesa, the plurality of first through-holes and the plurality of second through-holes form a mirror symmetry structure.

Hereinafter, embodiments of the present disclosure will be described in detail with reference to the accompanying drawings.

Figure 2:
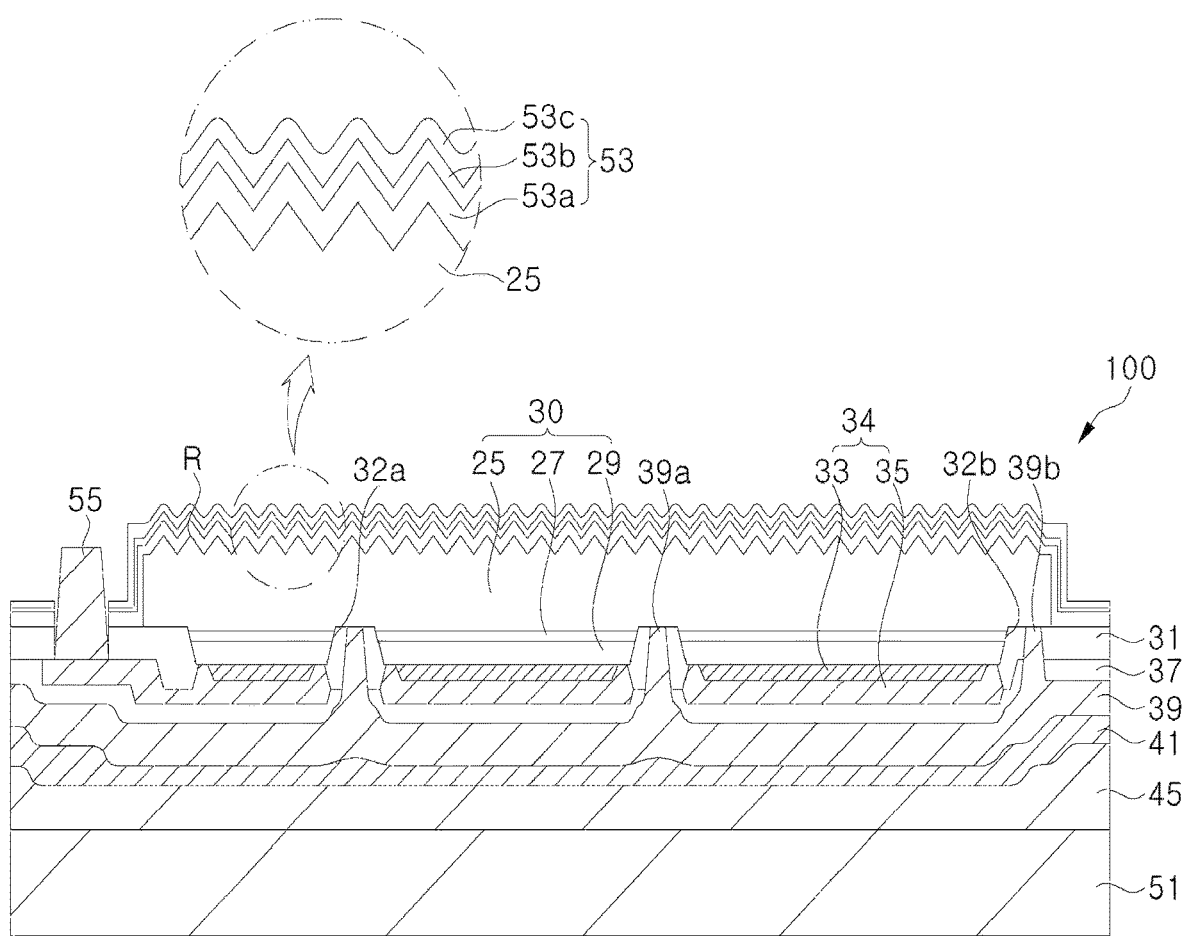
FIG. 2 is a cross-sectional view taken along line A-A of FIG. 1.

FIG. 1 is a schematic plan view of a light emitting diode according to one embodiment of the present disclosure and FIG. 2 is a cross-sectional view taken along line A-A of FIG. 1.

Referring to FIG. 1 and FIG. 2, a light emitting diode 100 includes a support substrate 51, a semiconductor stack structure 30, a first insulation layer 31, a second insulation layer 37, a first electrode 39, a second electrode 34, a first electrode-protecting metal layer 41, a bonding metal layer 45, an upper insulation layer 53, and upper electrode pads 55. The semiconductor stack structure 30 may include a first conductivity type semiconductor layer 25, an active layer 27 and a second conductivity type semiconductor layer 29, and the second electrode 34 may include an ohmic reflection layer 33 and a protective metal layer 35.

The support substrate 51 is distinguished from a growth substrate for growing compound semiconductor layers and refers to a secondary substrate attached to the grown compound semiconductor layers. The support substrate 51 may be a conductive substrate, such as a metal substrate or a semiconductor substrate, without being limited thereto. Alternatively, the support substrate 51 may be an insulating substrate, such as a sapphire substrate. The support substrate 51 may have a substantially rectangular shape, specifically a square shape.

The semiconductor stack structure 30 is disposed on the support substrate 51 and includes the second conductivity type semiconductor layer 29, the active layer 27 and the first conductivity type semiconductor layer 25. The second conductivity type semiconductor layer 29 may be a p-type nitride semiconductor layer and the first conductivity type semiconductor layer 25 may be an n-type nitride semiconductor layer, or vice versa. The semiconductor stack structure 30 is disposed in some region of the support substrate 51. That is, the support substrate 51 has a larger area than the semiconductor stack structure 30 and the semiconductor stack structure 30 is disposed within a region surrounded by an edge of the support substrate 51.

The first conductivity type semiconductor layer 25, the active layer 27 and the second conductivity type semiconductor layer 29 may be formed of III-N based compound semiconductors, for example, (Al, Ga, In)N semiconductors. Each of the first conductivity type semiconductor layer 25 and the second conductivity type semiconductor layer 29 may be composed of a single layer or multiple layers. For example, the first conductivity type semiconductor layer 25 and/or the second conductivity type semiconductor layer 29 may include a contact layer and a clad layer, and may also include a super-lattice layer. In addition, a roughened surface R may be formed on an upper surface of the first conductivity type semiconductor layer 25. The active layer 27 may have a single quantum well structure or a multiple quantum well structure. In one embodiment, the active layer 27 may be adapted to emit UV light and the first conductivity type semiconductor layer may include an Al-containing nitride semiconductor layer, such as AlGaN or AlInGaN.

The semiconductor stack structure 30 may include a mesa M disposed under the first conductivity type semiconductor layer 25. The mesa M includes the second conductivity type semiconductor layer 29 and the active layer 27 and is disposed under some region of the first conductivity type semiconductor layer 25. With this structure, a lower surface of the first conductivity type semiconductor layer 25 is exposed around the mesa M. The mesa M also has first through-holes 32a and second through-holes 32b formed through the second conductivity type semiconductor layer 29 and the active layer 27 to expose the first conductivity type semiconductor layer 25.

As shown in FIG. 1, the first through-holes 32a are disposed within a region surrounded by an edge of the mesa M. Each of the first through-holes 32a is surrounded by the active layer 27 and the second conductivity type semiconductor layer 29. The first through-holes 32a are arranged at substantially constant intervals and are spaced apart from the edge of the mesa M.

Each of the second through-holes 32*b* is partially surrounded by the active layer 27 and the second conductivity type semiconductor layer 29. The second through-holes 32*b* are disposed along the edge of the mesa M and the first conductivity type semiconductor layer 25 exposed through the second through-holes 32*b* is connected to the first conductivity type semiconductor layer 27 exposed around the mesa M.

The second through-holes 32*b* are indented from the edge of the mesa M into the mesa M. With this structure, a light emitting region can be secured between adjacent second through-holes 32*b*, thereby preventing reduction in light emitting area.

Figure 4A:
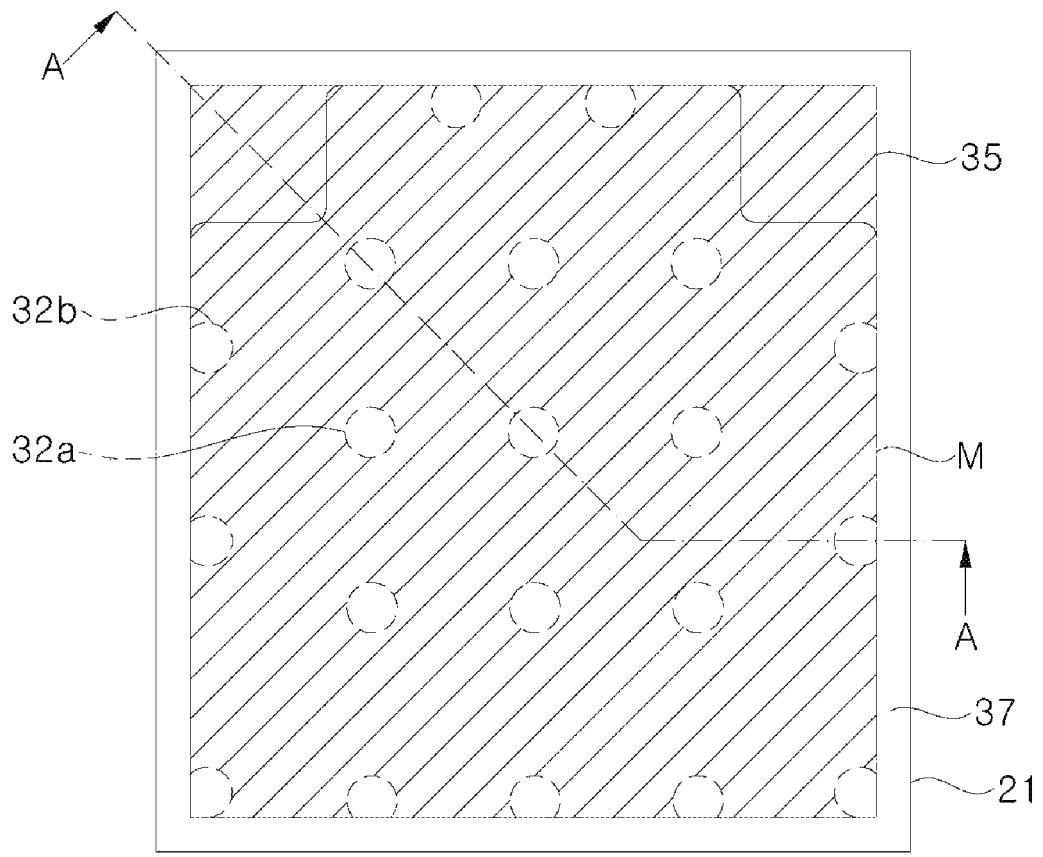

As shown in FIG. 4A, the second through-holes 32*b* may be disposed along each of four edges of the mesa M, thereby enabling even spreading of electric current in edge regions of the mesa M.

The second through-holes 32*b* may be disposed at constant intervals, but the present disclosure is not limited thereto. For example, a distance between adjacent second through-holes 32*b* may be changed depending upon arrangement of the upper electrode pads 55. In one embodiment, a distance between the second through-holes 32*b* in a region between the upper electrode pads 55 may be smaller than a distance between the first through-holes 32*a*.

In addition, a distance between the first through-hole 32*a* and the second through-hole 32*b* may be greater than or equal to the distance between the first through-holes 32*a*.

As shown in FIG. 2, the first insulation layer 31 is disposed between the semiconductor stack structure 30 and the support substrate 51 and covers the first conductivity type semiconductor layer 25 exposed around the mesa M and the first conductivity type semiconductor layer 25 exposed through the first and second through-holes 32*a*, 32*b*. The first insulation layer 31 may also cover a side surface of the mesa M and a portion of a lower surface of the mesa M. In addition, the first insulation layer 31 may extend outward from the semiconductor stack structure 30. Here, the first insulation layer 31 has openings formed in the first and second through-holes 32*a*, 32*b* to expose the first conductivity type semiconductor layer 25 such that the first electrode 39 is connected to the first conductivity type semiconductor layer 25 therethrough, and openings which expose the lower surface of the mesa M such that the second electrode 34 is connected to the second conductivity type semiconductor layer 29 therethrough.

The first insulation layer 31 may include a single layer or multiple layers of silicon oxide or silicon nitride. The first insulation layer 31 may include a distributed Bragg reflector in which insulation layers having different refractive indices, such as $SiO_2/TiO_2$ or $SiO_2/Nb_2O_5$, are repeatedly stacked on one above another.

The ohmic reflection layer 33 forms ohmic contact with the second conductivity type semiconductor layer 29 exposed through trenches of the first insulation layer 31. The ohmic reflection layer 33 may be formed to adjoin the first insulation layer 31 or may have an edge spaced apart from the first insulation layer 31, as shown in FIG. 2. The ohmic reflection layer 33 may include a reflection layer formed of, for example, Ag, and may include a metal layer for ohmic contact, such as a Ni layer. In some forms, the ohmic reflection layer 33 is confined in a region under the mesa M.

The protective metal layer 35 is disposed between the ohmic reflection layer 33 and the support substrate 51 and covers the ohmic reflection layer 33. The protective metal layer 35 may contact the second conductivity type semiconductor layer 29 exposed between the ohmic reflection layer 33 and the first insulation layer 31. The protective metal layer 35 also covers the first insulation layer 31 and extends outside a region under the semiconductor stack structure 30. The protective metal layer 35 exposes the first insulation layer 31 under the first and second through-holes 32*a*, 32*b* of the mesa M.

The protective metal layer 35 prevents migration of metal elements, for example, Ag, from the ohmic reflection layer 33 and also prevents the side surface of the ohmic reflection layer 33 from being exposed to the outside. The protective metal layer 35 may include, for example, Pt, Ni, Ti, W, Au, or alloys thereof.

As shown in FIG. 2, the second insulation layer 37 is disposed above the protective metal layer 35 to cover the protective metal layer 35. The second insulation layer 37 may cover the entire lower surface of the protective metal layer 35. In addition, the second insulation layer 37 may also cover a side surface of the protective metal layer 35 to prevent the side surface of the protective metal layer 35 from being exposed to the outside.

The second insulation layer 37 may be composed of a single layer or multiple layers of silicon oxide or silicon nitride, or may be a distributed Bragg reflector in which insulation layers having different indices of refraction, such as $SiO_2/TiO_2$ or $SiO_2/Nb_2O_5$, are repeatedly stacked one above another.

The first electrode 39 is disposed between the second insulation layer 37 and the support substrate 51 and is electrically connected to the first conductivity type semiconductor layer 25 through the first insulation layer 31 and the second insulation layer 37, as shown in FIG. 2. The first electrode 39 is disposed between the second electrode 34 and the support substrate 51.

The first electrode 39 includes first contact portions 39*a* connected to the first conductivity type semiconductor layer 25 in the first through-holes 32*a* and second contact portions 39*b* connected to the first conductivity type semiconductor layer 25 in the second through-holes 32*b*. The first contact portions 39*a* and the second contact portions 39*b* are insulated from the mesa M by the first insulation layer 31 and the second insulation layer 37.

The first electrode 39 may include an ohmic contact layer for ohmic contact with the first conductivity type semiconductor layer 25 and may also include a reflective metal layer. For example, the first electrode 39 may include Cr/Al, and may further include Ti/Ni.

The first electrode-protecting metal layer 41 may cover a lower surface of the first electrode 39. The first electrode-protecting metal layer 41 protects the first electrode 39 by preventing diffusion of metal elements such as Sn from the bonding metal layer 45. The first electrode-protection metal layer 41 may include, for example, Au, and may further include Ti and Ni. In some forms, the first electrode-protection metal layer 41 may be formed by, for example, repeatedly stacking Ti/Ni plural times, followed by stacking Au thereon.

The support substrate 51 may be bonded to the first electrode-protecting metal layer 41 via the bonding metal layer 45. The bonding metal layer 45 may be formed of, for example, AuSn or NiSn. Alternatively, the support substrate 51 may be formed on the first electrode-protecting metal layer 41 by, for example, plating. If the support substrate 51 is a conductive substrate, the support substrate 51 can act as a lower electrode pad. Alternatively, if the support substrate 51 is an insulating substrate, a lower electrode pad may be formed on the first electrode 39 or the first electrode-protecting metal layer 41 disposed on the support substrate 51.

The upper insulation layer 53 may cover upper and side surfaces of the semiconductor stack structure 30, particularly, upper and side surfaces of the first conductivity type semiconductor layer 25. The upper insulation layer 53 covers the roughened surface R and may be formed along protrusions and depressions of the roughened surface R, as shown in FIG. 2.

The upper insulation layer 53 may have a structure in which multiple material layers are stacked one above another. Referring to an enlarged portion of a cross-sectional view of FIG. 2, the upper insulation layer 53 may include a first layer 53a covering the roughened surface R of the first conductivity type semiconductor layer 25, a second layer 53b covering the first layer 53a, and a third layer 53c covering the second layer 53b.

In one embodiment, the first layer 53a covering the roughened surface R of the first conductivity type semiconductor layer 25 may include $SiO_2$. The second layer 53b may include $Al_2O_3$ and the third layer 53c may include $SiO_2$. The first layer 53a may have a larger thickness than the thickness of the second layer 53b, the thickness of the third layer 53c, or both. The thickness of the second layer 53b may be larger than or equal to the thickness of the third layer 53c. For example, the first layer 53a may have a thickness of 400 nm, and the second layer 53b and the third layer 53c both may have a thickness of about 60 nm.

The upper insulation layer 53 may include, or be composed of multiple material layers to prevent external moisture from entering the light emitting diode 100. In particular, use of $Al_2O_3$ for the upper insulation layer can prevent damage to the nitride semiconductor layer due to moisture. In particular, for a UV light emitting diode, the first conductivity type semiconductor layer 25 may include an Al-containing nitride semiconductor layer, which is vulnerable to moisture infiltration. Accordingly, with the upper insulation layer 53 comprising $Al_2O_3$, the light emitting diode can have improved reliability.

Further, uniformity of light emitted from the light emitting diode 100 can be improved through control of the refractive indices of the first conductivity type semiconductor layer 25, the first layer 53a, the second layer 53b, and the third layer 53c.

By way of example, the first conductivity type semiconductor layer 25 has a refractive index of about 2.4, $SiO_2$ has a refractive index of about 1.54, and $Al_2O_3$ has a refractive index of about 1.77. As such, the first conductivity type semiconductor layer 25 has a higher refractive index than the first layer 53a, whereby first total internal reflection of light can occur at an interface between the first conductivity type semiconductor layer 25 and the first layer 53a. In addition, the second layer 53b has a higher refractive index than a refractive index of the third layer 53c, whereby second total internal reflection of light can occur at an interface between the second layer 53b and the third layer 53c.

On the other hand, light reflected by the second total internal reflection at the interface between the second layer 53b and the third layer 53c travels to an interface between the second layer 53b and the first layer 53a and at least partially reflected again by third total internal reflection at the interface therebetween. As such, since part of light traveling from the second layer 53b to the third layer 53c undergoes the second total internal reflection at the interface between the second layer 53b and the third layer 53c and part of the light having undergone the second total internal reflection further undergoes the third total internal reflection at the interface between the second layer 53b and the first layer 53a, horizontal light diffusion may occur in the second layer 53b.

The second total internal reflection of light at the interface between the second layer 53b and the third layer 53c and the third total internal reflection of the light at the interface between the second layer and the first layer can improve light uniformity of the light emitting diode 100. Further, the first total internal reflection of light at the interface between the first conductivity type semiconductor layer 25 and the first layer 53a can also improve light uniformity of the light emitting diode 100 according to the embodiment.

Although the upper insulation layer 53 is illustrated as including the first to third layers 53a, 53b, 53c in this embodiment, it should be understood that other implementations are possible. For example, the upper insulation layer 53 may be composed of two layers or a greater number of material layers. Here, the upper insulation layer 53 may include an $Al_2O_3$ layer and a $SiO_2$ layer covering the $Al_2O_3$ layer. The $Al_2O_3$ layer may adjoin the surface of the first conductivity type semiconductor layer 25. For the upper insulation layer 53 composed of two layers of $Al_2O_3$ and $SiO_2$, the $Al_2O_3$ layer may have a smaller thickness than the $SiO_2$ layer. For example, the $Al_2O_3$ layer may have a thickness of about 100 nm to about 200 nm and the $SiO_2$ layer may have a thickness of about 300 nm to about 500 nm.

The $Al_2O_3$ layer may be formed by, for example, atomic layer deposition, which forms a thin layer having a high density. The $Al_2O_3$ layer formed by atomic layer deposition has high density and exhibits good layer covering properties, thereby securing excellent moisture blocking performance.

The upper insulation layer 53 may have holes 53h that expose the protective metal layer 35, as shown in FIG. 1. The holes 53h may be formed through the first insulation layer 31 to expose the protective metal layer 35.

The upper electrode pads 55 are connected to the second electrode 34, more specifically, the protective metal layer 35, adjacent to the first conductivity type semiconductor layer 25. The upper electrode pads 55 may be disposed near opposite corners of one edge of the support substrate 51 and may be separated from the semiconductor stack structure 30 in the horizontal direction. The upper electrode pads 55 may be connected to the protective metal layer 35 through the holes 53h that are formed through the first insulation layer 31 and the upper insulation layer 53, as shown in FIG. 2.

The upper electrode pads 55 are insulated from the first conductivity type semiconductor layer 25. The upper electrode pads 55 are also separated from the first electrode 39.

An elevation of a plane in which the upper electrode pads 55 adjoin the protective metal layer 35 may be placed in a region between the first conductivity type semiconductor layer 25 and the ohmic reflection layer 33, that is, in a region between a lower surface of the first conductivity type semiconductor layer 25 and a lower surface of the second conductivity type semiconductor layer 29. Accordingly, bottom surfaces of the upper electrode pads 55 are placed under the lower surface of the first conductivity type semiconductor layer 29 while the elevation of the upper electrode pads 55 being placed above the lower surface of the second conductivity type semiconductor layer 29. The first insulation layer 31 is placed between the lower surface of the first conductivity type semiconductor layer 25 and the protective metal layer 35. With the structure where the elevation of the upper electrode pads 55 is placed above the lower surface of the second conductivity type semiconductor layer 29, various processes for forming the upper electrode pads 55 can be easily performed, thereby enabling a process of manufacturing a light emitting diode to be performed efficiently.

According to this embodiment, the light emitting diode 100 may have a mirror symmetry structure as shown in FIG. 1. Based on the mirror symmetry structure, one-half of the light emitting diode 100 reflects the other half and the light emitting diode 100 is identical on the left and right sides as shown in FIG. 1. Accordingly, even spreading of electric current over the entire region of the light emitting diode 100 is possible.

FIG. 3A, FIG. 3B, FIG. 4A, FIG. 4B, FIG. 5A, FIG. 5B, FIG. 6A, FIG. 6B, FIG. 7A and FIG. 7B are plan views and sectional views illustrating a method of manufacturing the light emitting diode according to the embodiment of the present disclosure. FIG. 3A, FIG. 4A, FIG. 5A, FIG. 6A, and FIG. 7A are plan views and FIG. 3B, FIG. 4B, FIG. 5B, FIG. 6B, and FIG. 7B are sectional views of FIG. 3A, FIG. 4A, FIG. 5A, FIG. 6A, and FIG. 7A. The structure of the light emitting diode according to the embodiment will become more apparent through the method of manufacturing the light emitting diode described below.

Figure 3A:
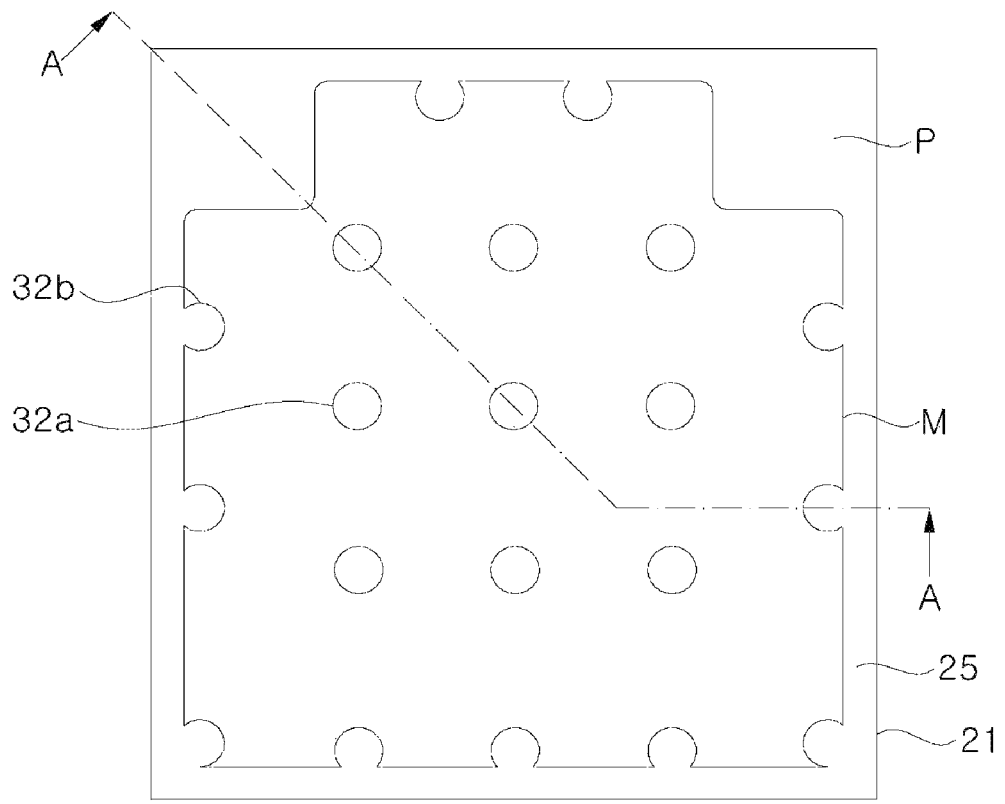
FIG. 3A, FIG. 3B, FIG. 4A, FIG. 4B, FIG. 5A, FIG. 5B, FIG. 6A, FIG. 6B, FIG. 7A, and FIG. 7B are plan views and sectional views illustrating a method of manufacturing the light emitting diode according to the one embodiment of the present disclosure, where.
Figure 3B:
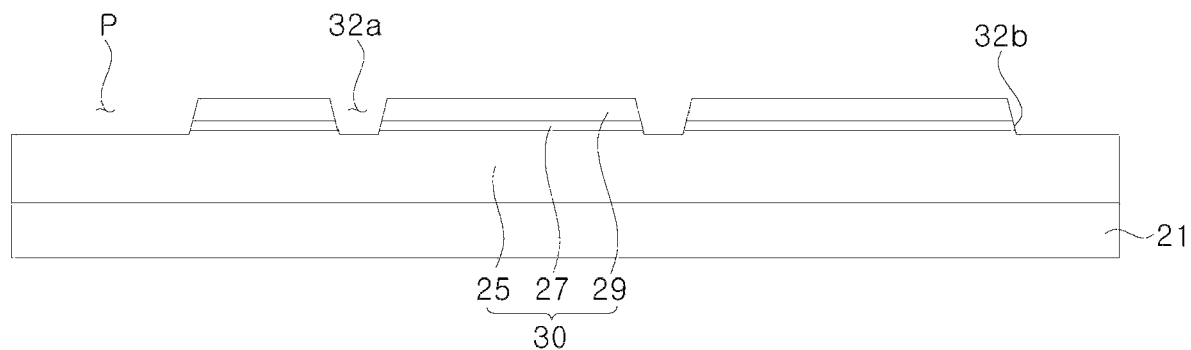

Referring to FIG. 3A and FIG. 3B, the semiconductor stack structure 30 including the first conductivity type semiconductor layer 25, the active layer 27 and the second conductivity type semiconductor layer 29 is formed on a growth substrate 21. The growth substrate 21 may be a sapphire substrate, without being limited thereto. Alternatively, the growth substrate 21 may be a different substrate, for example, a silicon substrate. Each of the first and second conductivity type semiconductor layers 25, 29 may be composed of a single layer or multiple layers. The active layer 27 may have a single quantum well structure or a multiple quantum well structure.

The compound semiconductor layers may be formed of III-N based compound semiconductors and may be grown on the growth substrate 21 by metal organic chemical vapor deposition (MOCVD), molecular beam epitaxy (MBE), or the like.

Before forming the compound semiconductor layers, a nucleation layer may be formed. The nucleation layer serves to relieve lattice mismatch between the sacrificial substrate 21 and the compound semiconductor layers and may be a GaN-based material layer, such as gallium nitride or aluminum nitride.

Then, the second conductivity type semiconductor layer 29 and the active layer 27 are subjected to patterning to expose the first conductivity type semiconductor layer 25. As a result, a mesa M is formed and first and second through-holes 32a, 32b are formed through the mesa M. As described above, the second through-holes 32b are arranged along edges of the mesa M and the first through-holes 32a are disposed in a region surrounded by the edges of the mesa M.

Although FIG. 3A and FIG. 3B show a single light emitting diode region, it should be understood that a plurality of light emitting diode regions may be defined on a single growth substrate 21 and isolation regions may be disposed between these light emitting diode regions. In FIG. 3A, edges of the growth substrate 21 correspond to the isolation regions. In such isolation regions, the second conductivity type semiconductor layer 29 and the active layer 27 are removed to expose the first conductivity type semiconductor layer 25 during formation of the mesa M. Further, in regions P for upper electrode pads 55 described below, the second conductivity type semiconductor layer 29 and the active layer 27 are removed to expose the first conductivity type semiconductor layer 25. The second conductivity type semiconductor layer 29 and the active layer 27 are previously removed from the isolation regions and the upper electrode pad regions P, thereby facilitating a process of forming the upper electrode pads 55 described below and a process of isolating light emitting diodes.

Figure 4B:
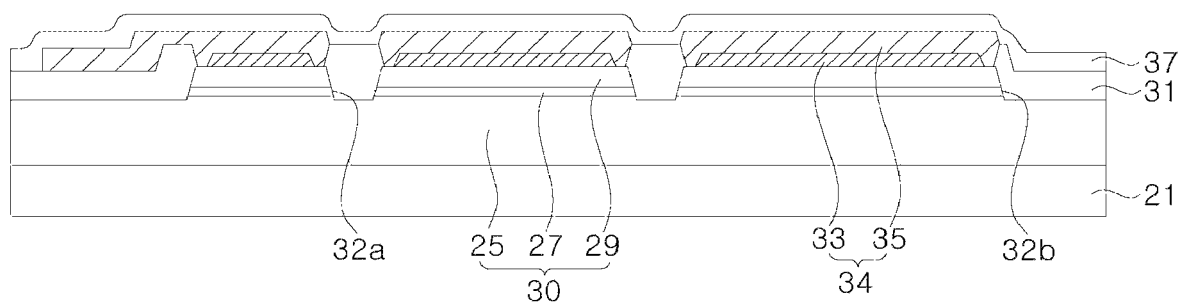

Referring to FIG. 4A and FIG. 4B, the first insulation layer 31 is formed to cover the mesa M. The first insulation layer 31 covers a side surface of the mesa M while covering the first conductivity type semiconductor layer 25 exposed around the mesa M and through the first and second through-holes 32a, 32b. The first insulation layer 31 may also partially cover an upper surface of the second conductivity type semiconductor layer 29. Here, the first insulation layer 31 exposes most of the upper surface of the second conductivity type semiconductor layer 29.

By way of example, the first insulation layer 31 may be deposited by plasma enhanced chemical vapor deposition and may be patterned by photolithography and etching.

Then, an ohmic reflection layer 33 is formed on the second conductivity type semiconductor layer 29. The ohmic reflection layer 33 may be deposited by electron beam evaporation and may be patterned by a lift-off process. A side surface of the ohmic reflection layer 33 may adjoin the first insulation layer 31 or may be separated therefrom, as shown in FIG. 4B.

Thereafter, a protective metal layer 35 is formed on the ohmic reflection layer 33. The protective metal layer 35 covers an upper surface of the ohmic reflection layer 33 and surrounds an edge 33a of the ohmic reflection layer 33 to cover the edge 33a of the ohmic reflection layer 33. A portion of the protective metal layer 35 may contact the second conductivity type semiconductor layer 29 between the first insulation layer 31 and the ohmic reflection layer 33. Here, the protective metal layer 35 may form Schottky contact with the second conductivity type semiconductor layer 29. Thus, no current is injected directly into the second conductivity type semiconductor layer 29 through the protective metal layer 35, thereby preventing current from crowding near the side surface of the mesa M. Furthermore, the protective metal layer 35 including a reflection layer can reflect light incident around the ohmic reflection layer 33, thereby improving light extraction efficiency.

The protective metal layer 35 exposes the first insulation layer 31 disposed in the first and second through-holes 32a, 32b. The protective metal layer 35 has through-holes having a similar shape to the first and second through-holes 32a, 32b and the first insulation layer 31 in the first and second through-holes 32a, 32b is exposed through the through-holes.

A portion of the protective metal layer 35 covers the first insulation layer 31 around the mesa M and extends outside the mesa M. The protective metal layer 35 extending outside the mesa M is connected to the upper electrode pads 55 described below.

A second insulation layer 37 is formed on the protective metal layer 35. The second insulation layer 37 covers upper and side surfaces of the protective metal layer 35. Accordingly, the second insulation layer 37 can prevent the protective metal layer 35 from being exposed to the outside. Alternatively, the second insulation layer 37 may be formed to cover the upper surface of the protective metal layer 35 without covering the side surface thereof such that the side surface of the protective metal layer 35 can be exposed to the outside in a completed light emitting diode.

Figure 5A:
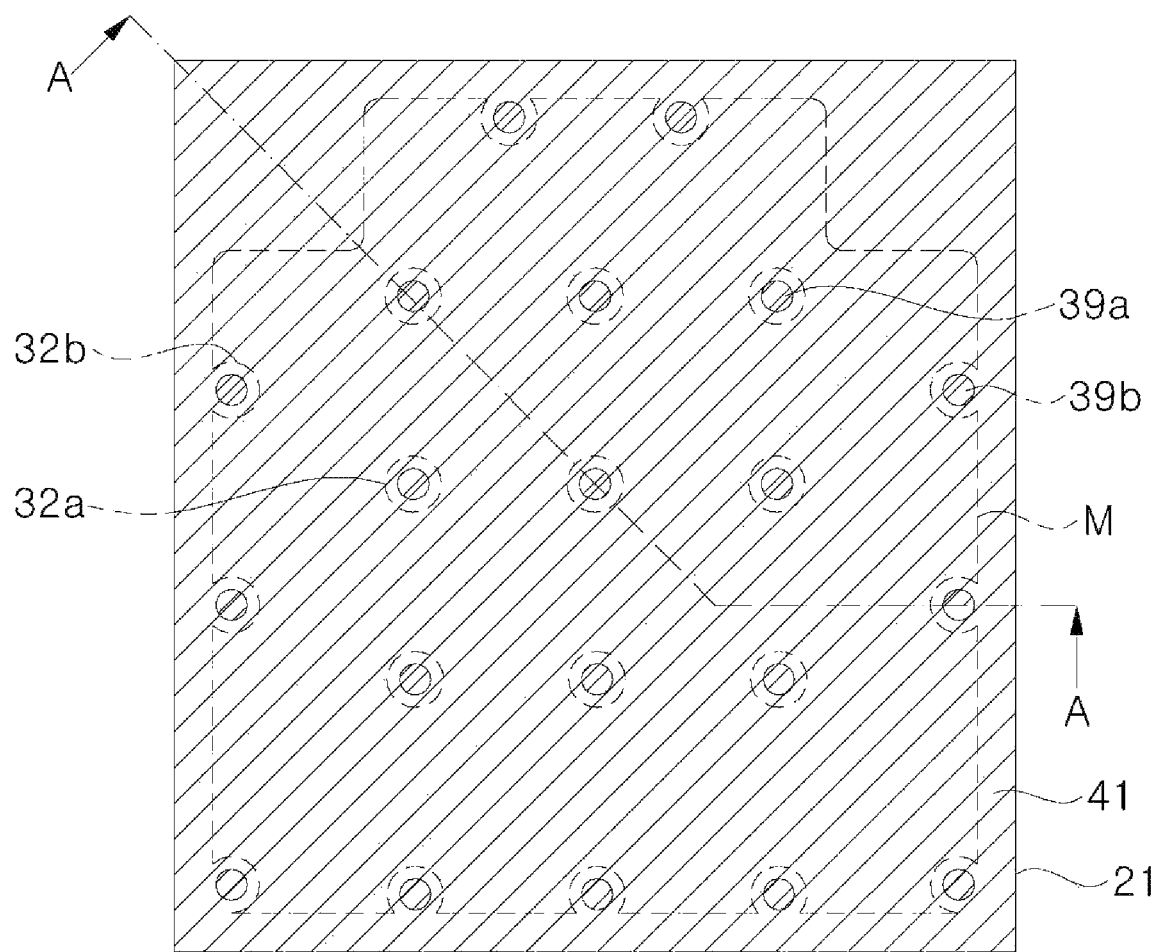
Figure 5B:
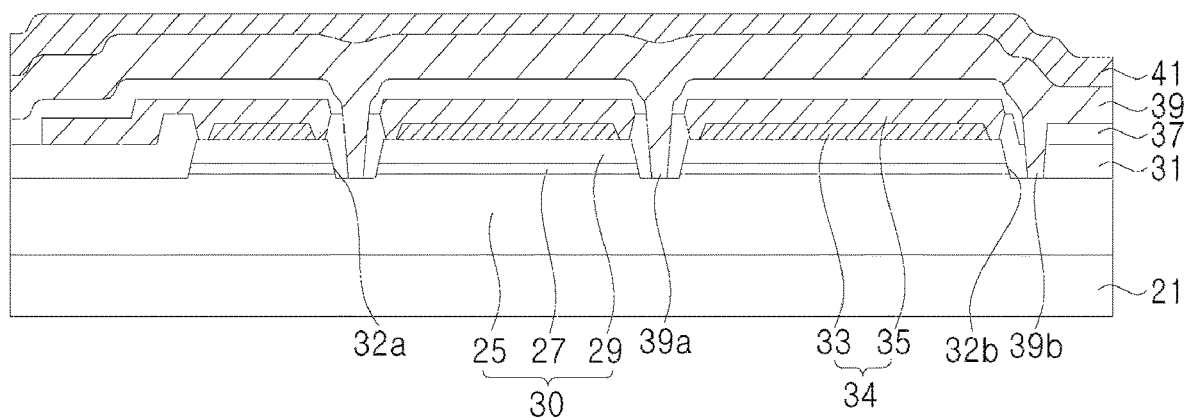

Referring to FIG. 5A and FIG. 5B, openings are formed to expose the first conductivity type semiconductor layer 25 in the first and second through-holes 32a, 32b through photolithography and etching processes on the second insulation layer 37 and the first insulation layer 31. Bottom surfaces of these openings correspond to first contact portions 39a and second contact portions 39b described below.

A first electrode 39 is formed on the second insulation layer 37. The first electrode 39 covers the second insulation layer 37 and has the first contact portions 39a and the second contact portions 39 connected to the first conductivity type semiconductor layer 25 through the openings formed through the second insulation layer 37 and the first insulation layer 31. The first contact portions 39a are connected to the first conductivity type semiconductor layer 25 in a region surrounded by the edges of the mesa M and the second contact portions 39b are connected to the first conductivity type semiconductor layer 25 near the edges of the mesa M.

A first electrode-protecting metal layer 41 is formed on the first electrode 39. The first electrode-protecting metal layer 41 is formed to prevent metal elements, such as Sn and the like, from diffusing into the first electrode 39 and may include Ti, Ni and Au. The first electrode-protection metal layer 41 may be omitted.

Figure 6A:
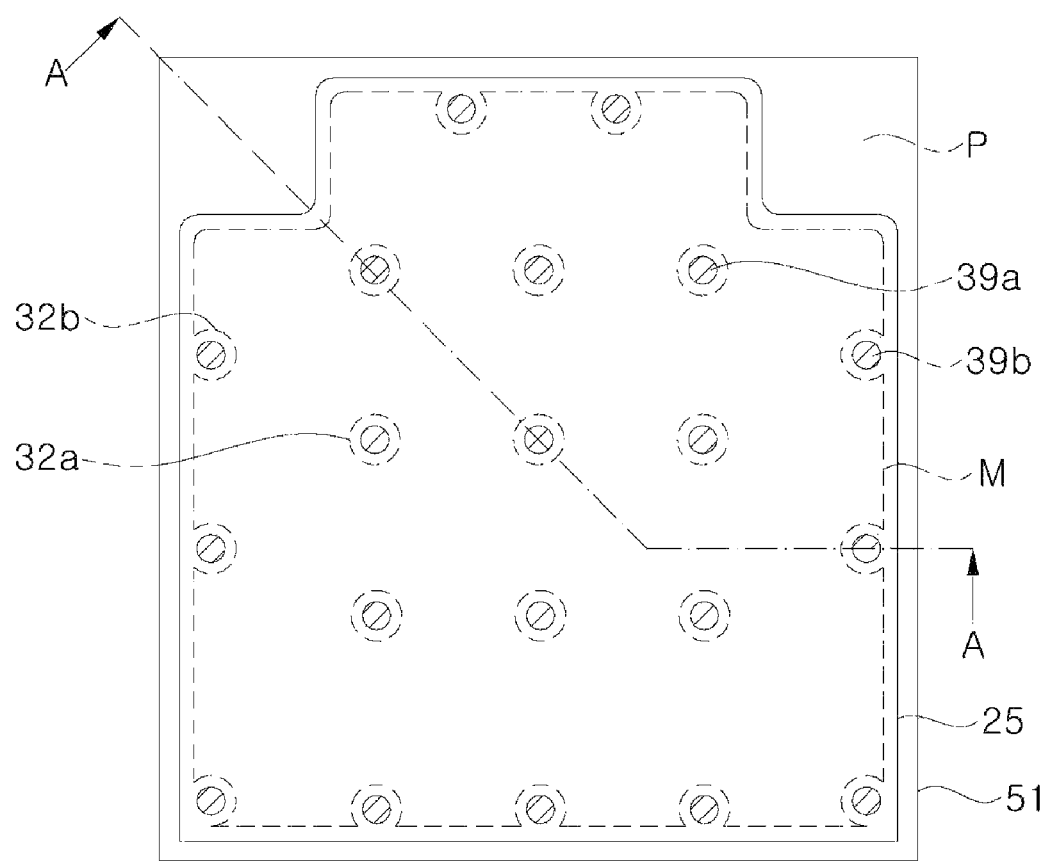
Figure 6B:
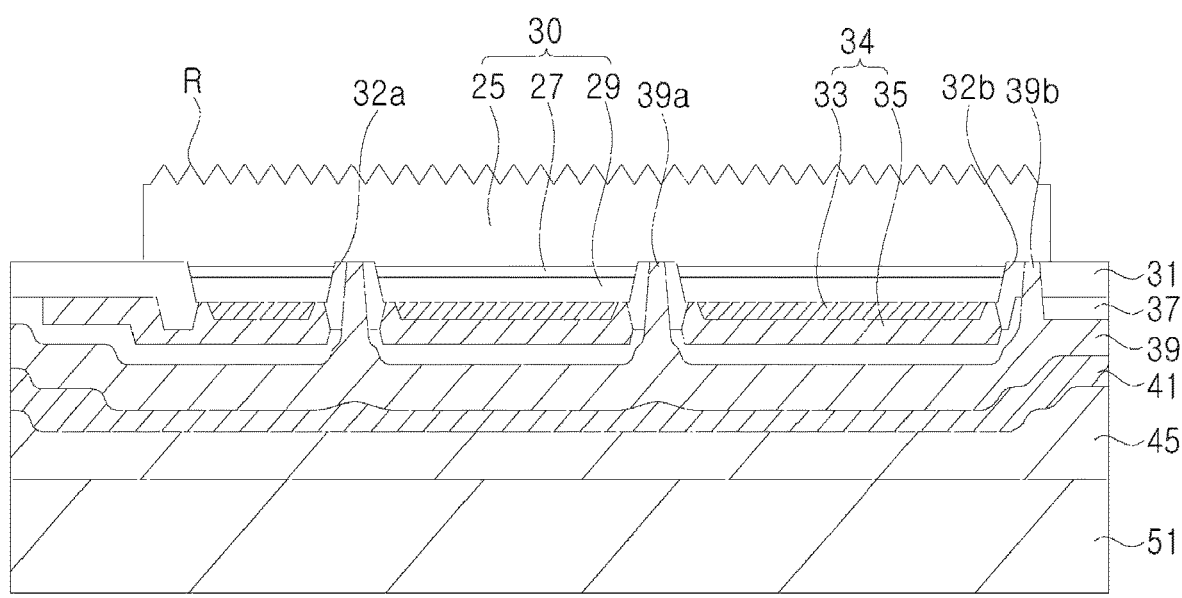

Referring to FIG. 6A and FIG. 6B, the support substrate 51 is attached to the semiconductor stack structure. The support substrate 51 may be manufactured separately from the semiconductor stack structure 30 and may be bonded to the first electrode 39 or the first electrode-protecting metal layer 41 via the bonding metal layer 45. Alternatively, the support substrate 51 may be formed on the first electrode 39 or the first electrode-protecting metal layer 41 by plating.

Next, the growth substrate 21 shown in FIGS. 5A and 5B is removed to expose the surface of the first conductivity type semiconductor layer 25 of the semiconductor stack structure 30. The growth substrate 21 may be removed by, for example, a laser lift-off (LLO) process. After the growth substrate 21 is removed, the nitride semiconductor layer 25a may be partially removed by etching in order to remove a region damaged by laser processing.

The first conductivity type semiconductor layer 25 is removed along regions for isolation of light emitting diodes. Here, the first conductivity type semiconductor layer 25 in regions P for formation of the upper electrode pads 55 is also removed. As the first conductivity type semiconductor layer 25 is removed, the first insulation layer 31 is exposed, as shown in FIG. 6B.

As described above, since the second conductivity type semiconductor layer 29 and the active layer 27 are previously removed from the isolation regions and the upper electrode pad regions P upon formation of the mesa M, only the first conductivity type semiconductor layer 25 can be removed without removing the second conductivity type semiconductor layer 29 and the active layer 27, when the semiconductor layers are removed from the isolation regions. Accordingly, it is possible to reduce process time in removal of the first conductivity type semiconductor layer 25 from the isolation regions, thereby further simplifying the manufacturing process.

In this embodiment, upon removal of the first conductivity type semiconductor layer 25, any other metal layers including the protective metal layer 35 are not exposed. Further, since the second conductivity type semiconductor layer 29 and the active layer 27 are sealed by the first insulation layer 31, short circuit due to etching by-products of the metallic materials may not occur, thereby securing high process reliability.

On the other hand, a roughened surface R is formed on the surface of the first conductivity type semiconductor layer 25. The roughened surface R may be formed by the technique, such as photo-enhanced chemical etching and the like.

Although the roughened surface R is illustrated as being formed after removal of the first conductivity type semiconductor layer 25 from the isolation regions in this embodiment, it should be understood that the roughened surface R may be formed before removal of the first conductivity type semiconductor layer 25 from the isolation regions.

Figure 7A:
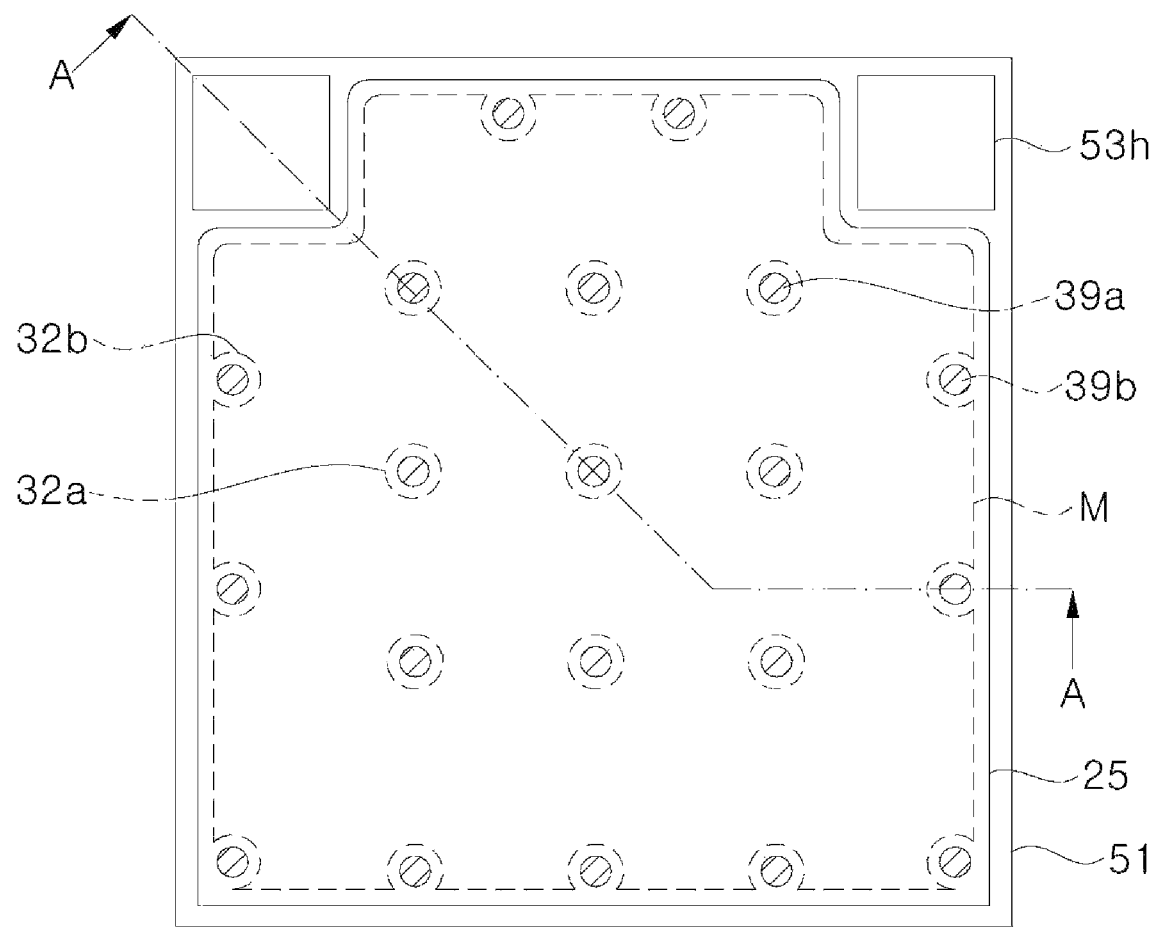
Figure 7B:
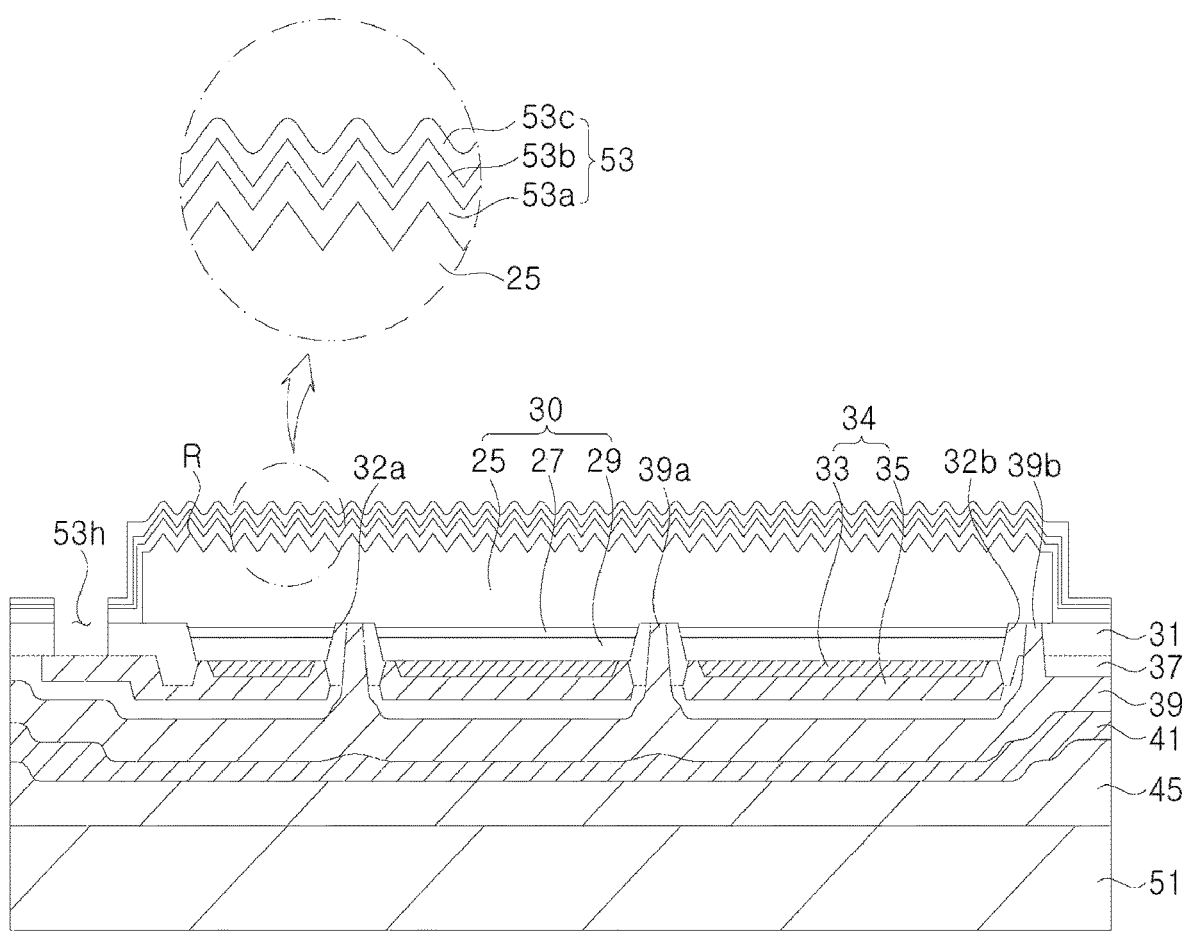

Referring to FIG. 7A and FIG. 7B, an upper insulation layer 53 is formed on the first conductivity type semiconductor layer 25 on which the roughened surface R is formed. The upper insulation layer 53 is formed along the roughened surface R to have a rough surface corresponding to the roughened surface R. The upper insulation layer 53 also covers the first insulation layer 31 exposed around the first conductivity type semiconductor layer 25.

As described above, the upper insulation layer 53 may include first to third layers 53a, 53b, 53c, but the present disclosure is not limited thereto. Alternatively, the upper insulation layer 53 may include two layers of $Al_2O_3$ and $SiO_2$ or three or more layers.

Next, the holes 53h are formed to expose the protective metal layer 35 by partially removing the upper insulation layer 53 and the first insulation layer 31. The holes 53a are formed in the upper electrode pad regions P such that the protective metal layer 35 extending to the upper electrode pad regions P is exposed, as shown in FIG. 7B. Then, the upper electrode pads 55 (see FIG. 1) are formed in the holes 53a and the semiconductor structure is divided into individual light emitting diodes along the isolation regions, thereby providing final light emitting diodes (see FIG. 1). Here, the first insulation layer 31, the second insulation layer 37, the first electrode 39, the first electrode-protecting metal layer 41, the bonding metal layer 45 and the support substrate 51 may also be divided together, whereby the side surfaces thereof may be parallel to each other. On the other hand, the ohmic reflection layer 33 and the protective metal layer 35 are disposed in a region surrounded by the edge of the divided support substrate and thus may be embedded in the light emitting diode without being exposed to the outside.

In this embodiment, since the second conductivity type semiconductor layer 29 and the active layer 27 are previously removed from the upper electrode pad regions P upon formation of the mesa M, the first insulation layer 31 and the upper insulation layer 53 have an elevation closer to the surface of the first conductivity type semiconductor layer 25 in the upper electrode pad regions P than the case where the second conductivity type semiconductor layer 29 and the active layer 27 are not previously removed. Accordingly, the process of forming the holes 53a is facilitated, and even when the upper surfaces of the upper electrode pads 55 have a constant elevation, the overall thickness of the upper electrode pads 55 can be reduced, thereby providing convenience in formation of the upper electrode pads 55.

Figure 8:
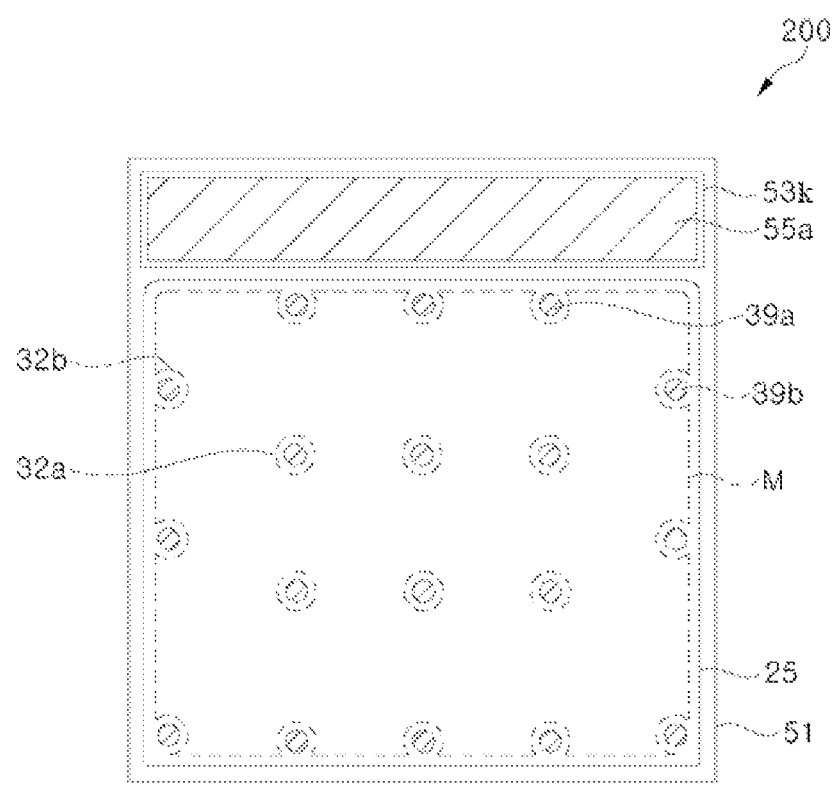
FIG. 8 is a schematic plan view of a light emitting diode according to another embodiment of the present disclosure.

FIG. 8 is a schematic plan view of a light emitting diode according to another embodiment of the present disclosure.

Referring to FIG. 8, a light emitting diode 200 according to this embodiment is generally similar to the light emitting diode described with reference to FIG. 1 and FIG. 2 except that an upper electrode pad 55a longitudinally extends along one edge of the support substrate 51.

Specifically, in the above embodiment shown in FIG. 1, two upper electrode pads 55 are disposed near opposite corners of the support substrate 51 to be separated from each other. In this embodiment, one upper electrode pad 55a extends to the opposite corners of the support substrate 51 along one edge thereof.

The upper electrode pad 55a may be connected to the protective metal layer 35 through a through-hole 53k formed through the upper insulation layer 53 and the first insulation layer 31. In this embodiment, the through-hole 53k has a similar shape to the upper electrode pad 55a and longitudinally extends along the edge of the support substrate 51. The protective metal layer 35 may be exposed over the entire lower region of the through-hole 5k.

The second through-holes 32b are disposed along the edge of the mesa M. In particular, the second through-holes 32 may be disposed near the edge of the mesa M adjacent to the upper electrode pad 55a.

Figure 9A:
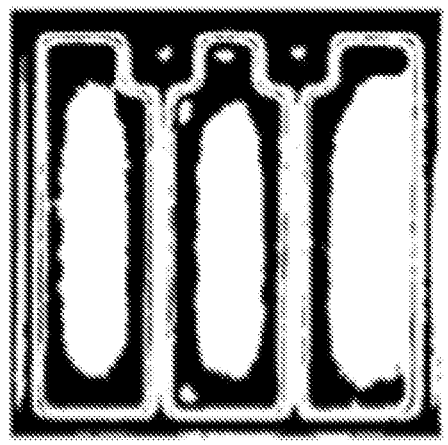
FIGS. 9A through 9C show images of luminous patterns of typical light emitting diodes and a light emitting diode according to one embodiment of the present disclosure, where.
Figure 9B:
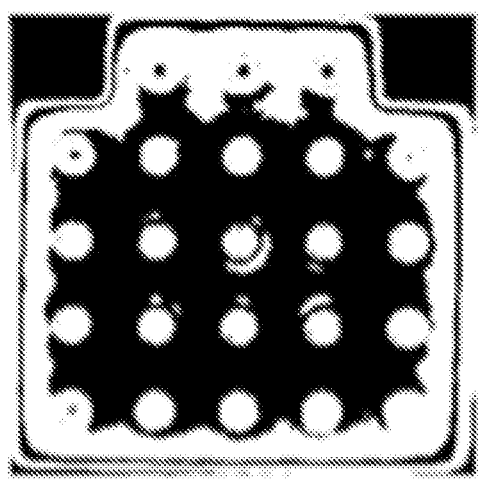
Figure 9C:
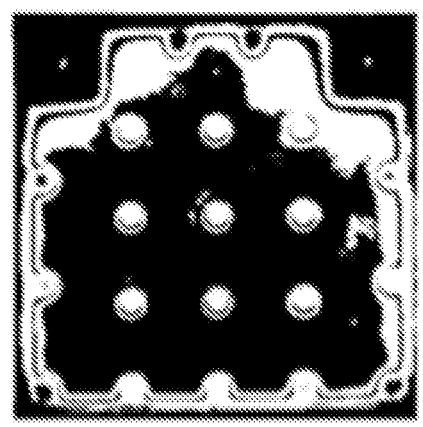

FIGS. 9A through 9C shows images of luminous patterns of typical light emitting diodes and a light emitting diode according to one embodiment of the present disclosure. FIG. 9A shows a luminous pattern of a light emitting diode having a vertical structure in which an anode pad is formed at a support substrate side, a cathode pad is formed on epitaxial layers and electrode extensions are formed. FIG. 9B shows a luminous pattern of a light emitting diode that is similar to the light emitting diode according to the one embodiment except that first contact portions are formed in the first through-holes without the second through-holes. FIG. 9C shows luminous patterns of the light emitting diode according to the one embodiment of the present disclosure, in which the contact portions are formed in the first and second through-holes.

Referring to FIG. 9A, it can be seen that the cathode pad and the electrode extensions block light and uniform emission of light does not occur in a light emitting region.

On the contrary, FIG. 9B shows that light is not blocked in a region outside the regions in which the upper electrode pads are formed. Here, it can be seen that light having relatively low intensity is emitted from the edge of the semiconductor stack structure.

On the other hand, FIG. 9C shows that light is emitted through the overall region of the semiconductor stack structure. In particular, it can be seen that the light emitting diode emits a greater quantity of light through the edge of the semiconductor stack structure than the light emitting diode of FIG. 9B.

As can be seen from FIG. 9B, in the structure where the second through-holes are omitted and only the first through-holes are present, the light emitting area is reduced by the first through-holes and a smaller quantity of light is emitted from edge regions of the light emitting diode. On the contrary, as shown in FIG. 9C, in the structure where the second through-holes are disposed in the edge regions of the light emitting diode, an effective light emitting area can be increased through reduction in the number of first through-holes. Furthermore, since the second through-holes are arranged in the edge regions of the light emitting diode, from which a smaller quantity of light is emitted, arrangement of the second through-holes does not reduce the effective light emitting area.

As a result of measurement of intensity of light according to drive current, it could be confirmed that the light emitting diodes according to the embodiments of the present disclosure had a higher intensity of light than conventional light emitting diodes and difference in intensity of light therebetween further increased with increasing electric current.

Figure 10:
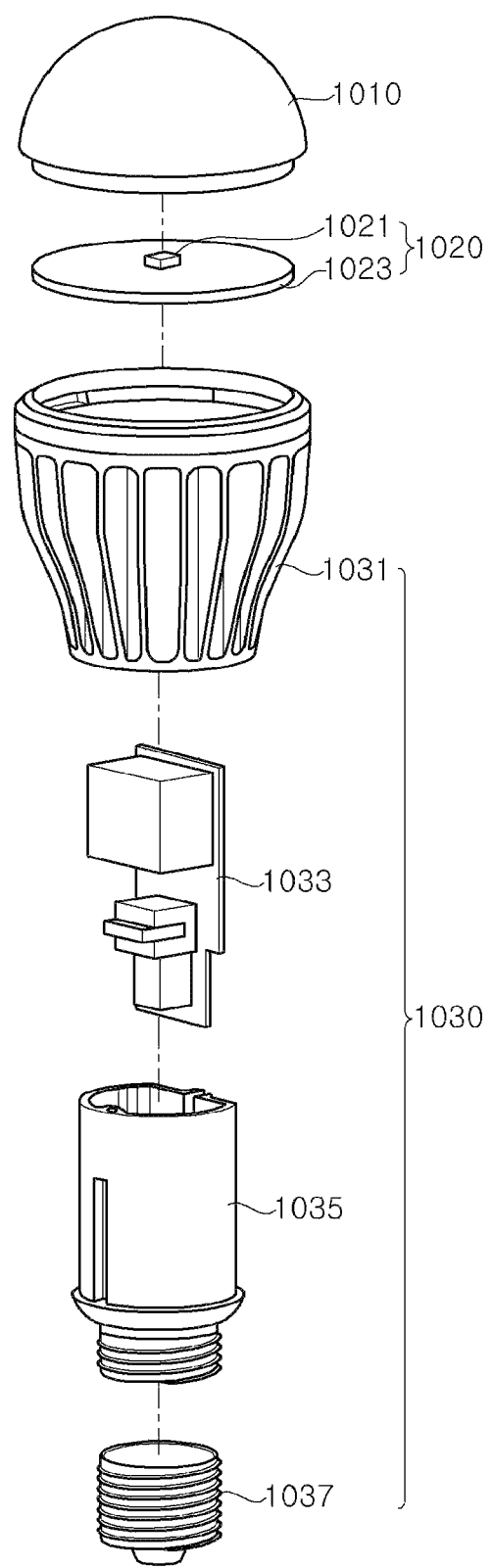
FIG. 10 is an exploded perspective view of a lighting apparatus to which a light emitting diode according to embodiments of the present disclosure is applied.

FIG. 10 is an exploded perspective view of a lighting apparatus to which a light emitting diode according to one embodiment including the light emitting diode 100, 200 is applied.

Referring to FIG. 10, the lighting apparatus according to this embodiment includes a diffusive cover 1010, a light emitting device module 1020, and a body 1030. The body 1030 may receive the light emitting device module 1020 and the diffusive cover 1010 may be disposed on the body 1030 to cover an upper side of the light emitting device module 1020.

The body 1030 may have any shape so long as the body can supply electric power to the light emitting device module 1020 while receiving and supporting the light emitting device module 1020. For example, as shown in the drawing, the body 1030 may include a body case 1031, a power supply 1033, a power supply case 1035, and a power source connector 1037.

The power supply 1033 is received in the power supply case 1035 to be electrically connected to the light emitting device module 1020, and may include at least one IC chip. The IC chip may regulate, change, or control electric power supplied to the light emitting device module 1020. The power supply case 1035 may receive and support the power supply 1033 and the power supply case 1035 having the power supply 1033 secured therein may be disposed within the body case 1031. The power source connector 1037 is disposed at a lower end of the power supply case 1035 and is coupled thereto. Accordingly, the power source connector 1037 is electrically connected to the power supply 1033 within the power supply case 1035 and may serve as a passage through which power can be supplied from an external power source to the power supply 1033.

The light emitting device module 1020 includes a substrate 1023 and a light emitting device 1021 disposed on the substrate 1023. The light emitting device module 1020 may be disposed at an upper portion of the body case 1031 and electrically connected to the power supply 1033. The light emitting device module 1020 includes the light emitting diode 100, 200 as described in the above embodiments.

As the substrate 1023, any substrate capable of supporting the light emitting device 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting device 1021 may include at least one of the light emitting diodes according to the embodiments described above.

In some forms, the diffusive cover 1010 is disposed on the light emitting device 1021 and may be secured to the body case 1031 to cover the light emitting device 1021. In other forms, the diffusive cover 1010 is disposed above the light emitting device 1021 and connected or coupled to the body case 1031 directly or indirectly via another component. In FIG. 10, the diffusive cover 1010 is illustrated to be arranged right above the light emitting device 1021, but embodiments of the present disclosure are not limited thereto. The diffusive cover 1010 may be formed of a light transmitting material and light orientation of the lighting apparatus may be adjusted through regulation of the shape and optical transmissivity of the diffusive cover 1010. Thus, the diffusive cover 1010 may be modified to have various shapes depending on usage and applications of the lighting apparatus.

Figure 11:
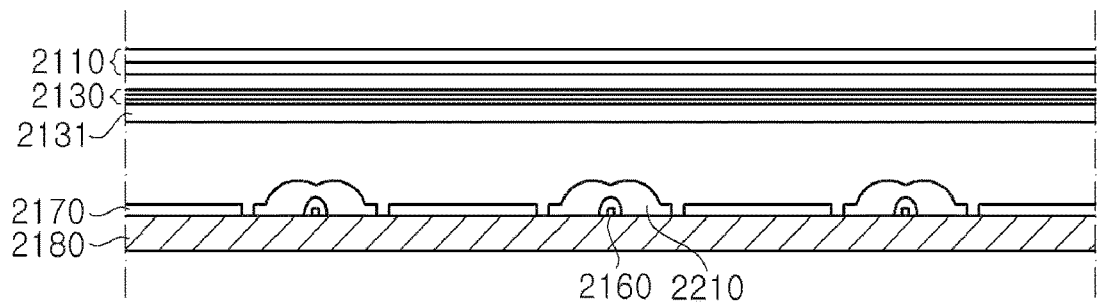
FIG. 11 is a cross-sectional view of one embodiment of a display apparatus to which a light emitting diode according to embodiments of the present disclosure is applied.

FIG. 11 is a cross-sectional view of one embodiment of a display apparatus to which a light emitting diode according to embodiments of the present disclosure including the light emitting diode 100, 200 is applied.

The display apparatus according to this embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting devices 2160. The light emitting devices 2160 include the light emitting diode 100, 200 as described in the above embodiments in detail and illustrated in FIG. 1 through FIG. 8. The backlight unit may further include a bottom cover 2180, a reflective sheet 2170, a diffusive plate 2131, and/or optical sheets 2130. The backlight unit also may include one or more light guiding structures which is configured to guide light in a predetermined direction, a predetermined pattern, etc. In FIG. 11, the light guiding structures may include the reflective sheet 2170, lens 2210, or both. The present disclosure is not limited thereto and the light guiding structures may include other structures available in the pertinent technical field.

The bottom cover 2180 may be open at an upper side thereof to receive the substrate, the light emitting devices 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the backlight unit includes a single substrate.

The light emitting devices 2160 may include at least one of the light emitting diodes according to the embodiments described above. The light emitting devices 2160 may be regularly arranged in a predetermined pattern on the substrate. In addition, a lens 2210 may be disposed on each of the light emitting devices 2160 to improve uniformity of light emitted from the plurality of light emitting devices 2160.

The diffusive plate 2131 and the optical sheets 2130 are disposed above the light emitting device 2160. Light emitted from the light emitting devices 2160 may be supplied in the form of sheet light to the display panel 2110 through the diffusive plate 2131 and the optical sheets 2130.

As such, the light emitting diodes 100, 200 according to the embodiments described above and illustrated in FIG. 1 through FIG. 8 may be applied to direct type displays like the display apparatus according to this embodiment.

Figure 12:
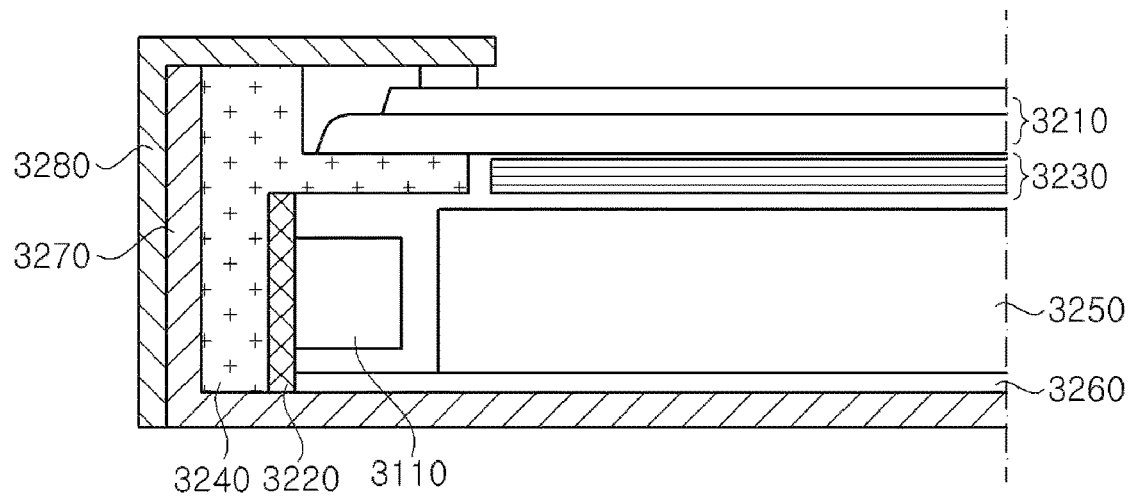
FIG. 12 is a cross-sectional view of another embodiment of a display apparatus to which a light emitting diode according to embodiments of the present disclosure is applied.

FIG. 12 is a cross-sectional view of another embodiment of the display apparatus to which a light emitting diode according to embodiments of the present disclosure including the light emitting diode 100, 200 is applied.

The display apparatus according to this embodiment includes a display panel 3210 on which an image is displayed, and a backlight unit disposed at a rear side of the display panel 3210 and emitting light thereto. Further, the display apparatus includes a frame 3240 supporting the display panel 3210 and receiving the backlight unit, and covers 3270, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3270, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spotlight into sheet light. In addition, the backlight unit according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting devices 3110 arranged at constant intervals on one surface of the substrate 3220. As the substrate 3220, any substrate capable of supporting the light emitting devices 3110 and being electrically connected thereto may be used without limitation. For example, the substrate 3220 may include a printed circuit board. The light emitting devices 3110 may include at least one of the light emitting diodes 100, 200 according to the embodiments described above. Light emitted from the light source module enters the light guide plate 3250 and is supplied to the display panel 3210 through the optical sheets 3230. The light guide plate 3250 and the optical sheets 3230 convert spotlight emitted from the light emitting devices 3110 into sheet light.

As such, the light emitting diodes according to the embodiments may be applied to edge type displays or lateral type displays like the display apparatus according to this embodiment.

Figure 13:
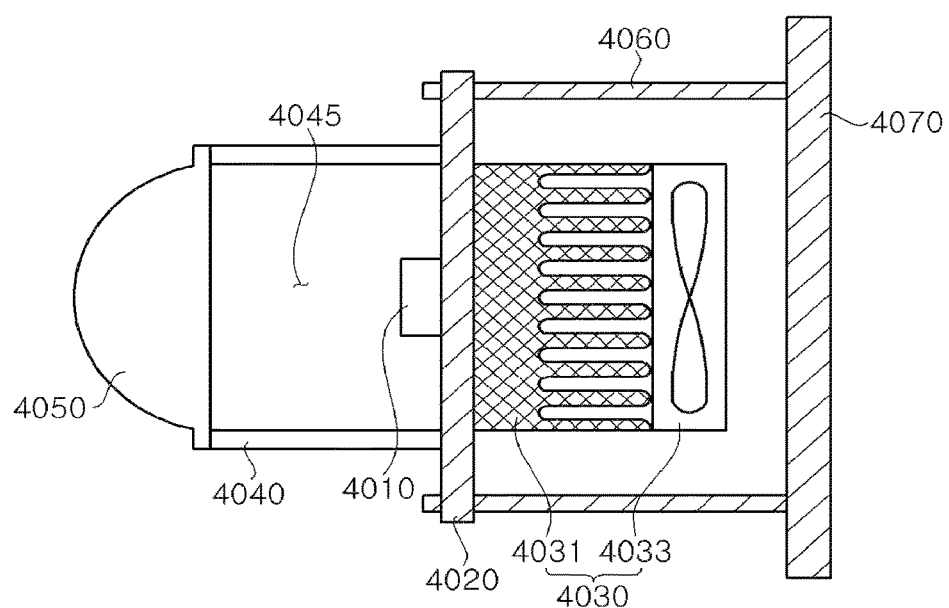
FIG. 13 is a cross-sectional view of a headlight to which a light emitting diode according to embodiments of the present disclosure is applied.

FIG. 13 is a cross-sectional view of a headlight to which a light emitting diode according to embodiments of the present disclosure is applied.

Referring to FIG. 13, the headlight according to this embodiment includes a lamp body 4070, a substrate 4020, a light emitting device 4010, and a cover lens 4050. The headlight may further include a heat dissipation unit 4030, a support rack 4060, and a connection member 4040. The light emitting device 4010 includes the light emitting diodes 100, 200 as described in the above-embodiments and illustrated in FIG. 1 through FIG. 8.

The substrate 4020 is secured by the support rack 4060 and is disposed above the lamp body 4070. As the substrate 4020, any member capable of supporting the light emitting device 4010 may be used without limitation. For example, the substrate 4020 may include a substrate having a conductive pattern, such as a printed circuit board. The light emitting device 4010 is disposed on the substrate 4020 and may be supported and secured by the substrate 4020. In addition, the light emitting device 4010 may be electrically connected to an external power source through the conductive pattern of the substrate 4020. Further, the light emitting device 4010 may include at least one of the light emitting diodes according to the embodiments described above.

The cover lens 4050 is disposed on a path of light emitted from the light emitting device 4010. For example, as shown in the drawing, the cover lens 4050 may be separated from the light emitting device 4010 by the connection member 4040 and may be disposed in a direction of supplying light emitted from the light emitting device 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting device 4010, and thus may act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting device 4010.

As such, the light emitting diodes according to the embodiments may be applied to headlights, particularly, headlights for vehicles, like the headlight according to this embodiment.

Although some embodiments have been described herein, it should be understood that these embodiments are provided for illustration only and are not to be construed in any way as limiting the present disclosure. It should be understood that features or components of one embodiment can also be applied to other embodiments without departing from the spirit and scope of the present disclosure.

The invention claimed is:

1. A light emitting diode comprising: a support substrate; a first conductivity type semiconductor layer disposed on the support substrate; an upper insulation layer disposed on the first conductivity type semiconductor layer and comprising a plurality of material layers; a mesa comprising an active layer and a second conductivity type semiconductor layer and disposed under a partial region of the first conductivity type semiconductor layer to expose an edge of the first conductivity type semiconductor layer, the mesa having a plurality of first through-holes and a plurality of second through-holes exposing the first conductivity type semiconductor layer through the second conductivity type semiconductor layer and the active layer; a first electrode disposed between the second conductivity type semiconductor layer and the support substrate, the first electrode comprising: first contact portions electrically connected to the first conductivity type semiconductor layer through the plurality of first through-holes; and second contact portions electrically connected to the first conductivity type semiconductor layer through the plurality of second through-holes; a second electrode disposed between the first electrode and the second conductivity type semiconductor layer and electrically connected to the second conductivity type semiconductor layer; and at least one upper electrode pad disposed adjacent to the first conductivity type semiconductor layer and connected to the second electrode; a first insulation layer disposed between the mesa and the support substrate; a second insulation layer interposed between the first electrode and the second electrode; and a reflection layer disposed between the second insulation layer and the first electrode; wherein one or more of the plurality of first through-holes are surrounded by the active layer and the second conductivity type semiconductor layer and are disposed within a region surrounded by edges of the mesa; and one or more of the plurality of second through-holes are partially surrounded by the active layer and the second conductivity type semiconductor layer and are disposed along the edges of the mesa.

2. The light emitting diode according to claim 1, wherein:
the first conductivity type semiconductor layer has a roughened surface; and
the upper insulation layer comprises an $Al_2O_3$ layer covering the roughened surface of the first conductivity type semiconductor layer and a $SiO_2$ layer covering the $Al_2O_3$ layer.

3. The light emitting diode according to claim 1, wherein the support substrate has a rectangular shape on a plan view; and
the at least one upper electrode pad extends along one edge of the support substrate such that the upper electrode pad is longitudinally disposed in a space formed between the one edge of the mesa and one edge of the support substrate.

4. The light emitting diode according to claim 3, wherein one or more of the second through-holes are disposed between the upper electrode pad and the one edge of the mesa.

5. The light emitting diode according to claim 1, wherein the support substrate has a rectangular shape on a plan view; and
the at least one upper electrode pad further comprises a first upper electrode pad and a second upper electrode pad disposed near opposite corners of the support substrate along edges of the support substrate corresponding to the opposite corners.

6. The light emitting diode according to claim 5, wherein a partial region of the mesa is disposed between the first and the second upper electrode pads; and
one or more of the plurality of second through-holes are formed in the partial region of the mesa.

7. The light emitting diode according to claim 1, wherein the plurality of second through-holes are arranged to be disposed adjacent to four edges of the support substrate.

8. The light emitting diode according to claim 6, wherein the first and the second upper electrode pads, the mesa, the plurality of first through-holes and the plurality of second through-holes form a mirror symmetry structure.

9. The light emitting diode according to claim 1, wherein:
the first insulation layer insulates the first electrode from the first conductivity type semiconductor layer; and
the reflection layer comprises a distributed Bragg reflector.

10. The light emitting diode according to claim 1, further comprising:
a bonding metal layer interposed between the first electrode and the support substrate; and
a first electrode-protecting metal layer interposed between the bonding metal layer and the first electrode and covering the first electrode.

11. The light emitting diode according to claim 1, wherein:
the second electrode comprises an ohmic reflection layer forming ohmic contact with the second conductivity type semiconductor layer and a protective metal layer protecting the ohmic reflection layer;
the protective metal layer extends outside the first conductivity type semiconductor layer and the at least one upper electrode pad is connected to the protective metal layer through the upper insulation layer and the first insulation layer; and the second insulation layer covers a side surface of the protective metal layer.

12. A lighting apparatus comprising:
a light emitting device module;
a body configured to receive the light emitting device module; and
a cover structure including a light transmitting material and configured to transmit light from the light emitting device module;
wherein the light emitting device module comprises:
at least one substrate; and
a plurality of light emitting diodes including the light emitting diode of claim 1.

13. The lighting apparatus of claim 12, wherein:
the cover structure is further shaped to adjust orientation of the light from the light emitting device module; and
the orientation of the light from the light emitting device module is adjusted as optical transmissivity of the light transmitting material varies.

14. A light emitting diode comprising:
a support substrate;
a first conductivity type semiconductor layer disposed on the support substrate;
an upper insulation layer disposed on the first conductivity type semiconductor layer;
a mesa comprising an active layer and a second conductivity type semiconductor layer and disposed under a partial region of the first conductivity type semiconductor layer to expose an edge of the first conductivity type semiconductor layer, the mesa having a plurality of first through-holes and a plurality of second through-holes exposing the first conductivity type semiconductor layer through the second conductivity type semiconductor layer and the active layer;
a first electrode disposed between the second conductivity type semiconductor layer and the support substrate, the first electrode comprising:
first contact portions electrically connected to the first conductivity type semiconductor layer through the plurality of first through-holes; and
second contact portions electrically connected to the first conductivity type semiconductor layer through the plurality of second through-holes;
a second electrode disposed between the first electrode and the second conductivity type semiconductor layer and electrically connected to the second conductivity type semiconductor layer; and
at least one upper electrode pad disposed adjacent to the first conductivity type semiconductor layer and connected to the second electrode, wherein:
one or more of the plurality of first through-holes are surrounded by the active layer and the second conductivity type semiconductor layer and are disposed within a region surrounded by edges of the mesa;
one or more of the plurality of second through-holes are partially surrounded by the active layer and the second conductivity type semiconductor layer and are disposed along the edges of the mesa;
the first conductivity type semiconductor layer has a roughened surface; and
the upper insulation layer comprises:

a first layer covering the roughened surface of the first conductivity type semiconductor layer;
a second layer covering the first layer and having a higher refractive index than the first layer; and
a third layer covering the second layer and having a lower refractive index than the second layer.

15. The light emitting diode according to claim 14, wherein both the first layer and the third layer comprise $SiO_2$ and the second layer comprises $Al_2O_3$.

16. The light emitting diode according to claim 15, wherein a thickness of the first layer is greater than a thickness of the second layer; and
the thickness of the first layer is greater than a thickness of the third layer.

17. The light emitting diode according to claim 14, wherein the first conductivity type semiconductor layer comprises an Al-containing nitride semiconductor layer.

18. A light emitting diode comprising:
a first conductivity type semiconductor layer;
an upper insulation layer disposed on the first conductivity type semiconductor layer;
a mesa comprising an active layer and a second conductivity type semiconductor layer and disposed under the first conductivity type semiconductor layer to expose an edge of the first conductivity type semiconductor layer, a plurality of first through-holes and a plurality of second through-holes exposing the first conductivity type semiconductor layer through the second conductivity type semiconductor layer and the active layer;
a first electrode comprising:
first contact portions electrically connected to the first conductivity type semiconductor layer through the plurality of first through-holes; and
second contact portions electrically connected to the first conductivity type semiconductor layer through the plurality of second through-holes;
a second electrode disposed between the first electrode and the second conductivity type semiconductor layer and electrically connected to the second conductivity type semiconductor layer;
a first insulation layer disposed below the mesa;
a second insulation layer interposed between the first electrode and the second electrode; and
a reflection layer disposed between the second insulation layer and the first electrode;
wherein one or more of the plurality of first through-holes are disposed within a region surrounded by edges of the mesa; and
one or more of the plurality of second through-holes are disposed along the edges of the mesa.

19. The light emitting diode of claim 18, further comprising at least one upper electrode pad disposed adjacent to the first conductivity type semiconductor layer and connected to the second electrode;
wherein the plurality of second through-holes are arranged to be disposed adjacent to four edges of the mesa.

20. The light emitting diode according to claim 19, wherein the at least one upper electrode pad, the mesa, the plurality of first through-holes and the plurality of second through-holes form a mirror symmetry structure.

* * * * *